(12) United States Patent
Masuda et al.

(10) Patent No.: US 10,211,284 B2
(45) Date of Patent: Feb. 19, 2019

(54) SILICON CARBIDE SEMICONDUCTOR DEVICE AND METHOD FOR MANUFACTURING SAME

(71) Applicant: Sumitomo Electric Industries, Ltd., Osaka-shi (JP)

(72) Inventors: Takeyoshi Masuda, Osaka (JP); Keiji Wada, Osaka (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 83 days.

(21) Appl. No.: 14/646,666

(22) PCT Filed: Nov. 27, 2013

(86) PCT No.: PCT/JP2013/081864
§ 371 (c)(1),
(2) Date: May 21, 2015

(87) PCT Pub. No.: WO2014/112213
PCT Pub. Date: Jul. 24, 2014

(65) Prior Publication Data
US 2016/0293690 A1    Oct. 6, 2016

(30) Foreign Application Priority Data

Jan. 15, 2013    (JP) .................................. 2013-004631

(51) Int. Cl.
*H01L 29/00* (2006.01)
*H01L 29/06* (2006.01)
(Continued)

(52) U.S. Cl.
CPC ........ *H01L 29/0623* (2013.01); *H01L 21/765* (2013.01); *H01L 29/0634* (2013.01);
(Continued)

(58) Field of Classification Search
CPC ............... H01L 29/0623; H01L 21/765; H01L 29/0634; H01L 29/0661; H01L 29/1608;
(Continued)

(56) References Cited

U.S. PATENT DOCUMENTS 6,037,632 A    3/2000  Omura et al.
2002/0096715 A1*  7/2002  Sumida ............... H01L 29/0634
                                                  257/342
(Continued)

FOREIGN PATENT DOCUMENTS

JP    09-191109 A    7/1997
JP    11-330496 A    11/1999
(Continued)

OTHER PUBLICATIONS

International Search Report in PCT International Application No. PCT/JP2013/081864, dated Feb. 25, 2014.
(Continued)

*Primary Examiner* — Mounir Amer
*Assistant Examiner* — Alexander Belousov
(74) *Attorney, Agent, or Firm* — Venable LLP; Michael A. Sartori; Laura G. Remus

(57) ABSTRACT

A silicon carbide film has first and second main surfaces. The second main surface has an element formation surface and a termination surface. The silicon carbide film has a first range that constitutes a first main surface and an intermediate surface opposite to the first main surface, and a second range that is provided on the intermediate surface and constitutes the element formation surface. The first range includes: a first breakdown voltage holding layer, and a guard ring region partially provided at the intermediate surface in the termination portion. The second range has a second breakdown voltage holding layer. The second range has one of a structure only having the second breakdown
(Continued)

voltage holding layer in the termination portion and a structure disposed only in the element portion of the element portion and the termination portion.

10 Claims, 23 Drawing Sheets

(51) Int. Cl.
*H01L 29/78* (2006.01)
*H01L 29/739* (2006.01)
*H01L 29/16* (2006.01)
*H01L 29/66* (2006.01)
*H01L 21/765* (2006.01)
*H01L 29/872* (2006.01)

(52) U.S. Cl.
CPC ...... *H01L 29/0661* (2013.01); *H01L 29/1608* (2013.01); *H01L 29/66068* (2013.01); *H01L 29/7397* (2013.01); *H01L 29/78* (2013.01); *H01L 29/7802* (2013.01); *H01L 29/7811* (2013.01); *H01L 29/7813* (2013.01); *H01L 29/872* (2013.01)

(58) Field of Classification Search
CPC ........... H01L 29/66068; H01L 29/7397; H01L 29/78; H01L 29/7802; H01L 29/7811; H01L 29/7813; H01L 29/872
See application file for complete search history.

(56) References Cited

U.S. PATENT DOCUMENTS

2008/0001159 A1 1/2008 Ota et al.
2011/0284873 A1* 11/2011 Nishiguchi ....... H01L 29/66068
257/77

FOREIGN PATENT DOCUMENTS

| JP | 2001-144292 A | 5/2001 |
| JP | 2003-197921 A | 7/2003 |
| JP | 2007-258742 A | 10/2007 |
| JP | 2008-016461 A | 1/2008 |
| WO | WO-99/26296 A2 | 5/1999 |
| WO | 02/49114 A2 | 6/2002 |

OTHER PUBLICATIONS

Extended European Search Report in European Application No. 13871443.1, dated Aug. 11, 2016.
Mihaila et al., "Buried Field Rings—A Novel Edge Termination Method for 4H-SiC High Voltage Devices," IEEE 2002.
Li et al., "High-Voltage (3 kV) UMOSFETs in 4H-SiC," IEEE Transactions on Electronic Devices, vol. 49. No. 6, Jun. 2002.
Notification of First Office Action in counterpart Chinese Patent Application No. 201380065488.X, dated Dec. 5, 2016.

* cited by examiner

SILICON CARBIDE SEMICONDUCTOR DEVICE AND METHOD FOR MANUFACTURING SAME

TECHNICAL FIELD

The present invention relates to a silicon carbide (SiC) semiconductor device and a method for manufacturing the silicon carbide semiconductor device, in particular, a silicon carbide semiconductor device having a guard ring region and a method for manufacturing such a silicon carbide semiconductor device.

BACKGROUND ART

Regarding a Si (silicon) MOSFET (Metal Oxide Semiconductor Field Effect Transistor), which is a power semiconductor device used widely, a main determination factor for breakdown voltage is the upper limit of an electric field strength with which a drift layer serving as a breakdown voltage holding region can withstand. A drift layer made of Si can be broken at a portion fed with an electric field of about 0.3 MV/cm or more. Accordingly, it is required to suppress the electric field strength to be less than a predetermined value in the entire drift layer of the MOSFET. The simplest method is to provide the drift layer with a low impurity concentration. However, this method provides a large on-resistance of the MOSFET, disadvantageously. In other words, there is a trade-off relation between the on-resistance and the breakdown voltage.

Regarding a typical Si MOSFET, Japanese Patent Laying-Open No. 9-191109 illustrates a trade-off relation between the on-resistance and the breakdown voltage in consideration of a theoretical limit resulting from a property value of Si. In order to cancel this trade off, it is disclosed to add a lower p type embedded layer and an upper p type embedded layer in an n type base layer provided on an n type substrate provided on a drain electrode. By the lower p type embedded layer and the upper embedded layer, the n type base layer is divided into a lower stage, a middle stage, and an upper stage, each of which has an equal thickness. According to this publication, voltage is equally held by each of the three stages, whereby the maximum electric field of each stage is maintained to be equal to or less than the critical electric field strength.

Moreover, the publication described above discloses to provide a termination structure having a guard ring (also referred to as "Field Limiting Ring"). Specifically, in the termination structure, guard rings are provided at depth positions respectively corresponding to the three stages described above. More specifically, in the termination portion, embedded guard rings are respectively provided in the n type base layer at two depth positions different from each other, and a guard ring is provided also at a surface of the n type base layer. With these three types of guard rings, the maximum electric field of each stage is also maintained to be equal to or less than the critical strength in the termination structure.

In addition, more generally, a termination structure having a guard ring only at a surface of an n type base layer without having the embedded guard rings described above has been used more widely.

CITATION LIST

Patent Document

PTD 1: Japanese Patent Laying-Open No. 9-191109

SUMMARY OF INVENTION

Technical Problem

As a method for providing further improvement with regard to the trade off between the on-resistance and the breakdown voltage, it has been actively discussed to use SiC instead of Si in recent years. SiC is a material capable of sufficiently withstanding an electric field strength of 0.4 MV/cm or more unlike Si. In other words, under such an electric field strength, a Si layer is likely to be broken whereas a SiC layer is not broken. When such a high electric field can be applied, a problem arises in terms of breakage resulting from electric field concentration at a specific position in the MOSFET structure. For example, in the case of a trench type MOSFET, a breakage phenomenon of a gate insulating film caused by electric field concentration in the gate insulating film rather than a SiC layer is a main determination factor for breakdown voltage. Thus, the determination factor for breakdown voltage differs between the Si semiconductor device and the SiC semiconductor device. Hence, in order to improve the breakdown voltage of the SiC semiconductor device, it is not the best approach to simply apply the technique of the above-described publication, which assumes use of Si. Hence, as to the termination structure for maintaining breakdown voltage, it is preferable to use an optimal one for a SiC semiconductor device.

When the general guard ring, i.e., the guard ring at the semiconductor layer is used as the termination structure, electric field concentration takes place in the vicinity of the surface of the semiconductor layer. As a result, the electric field is likely to be concentrated in an element portion at a position adjacent to the guard ring and close to the surface of the semiconductor layer. In this position, a breakage phenomenon can be caused by the electric field concentration. Moreover, in the case where the guard rings are provided in both the semiconductor layer and at the semiconductor layer as described in the above-described publication, the structure of the semiconductor device is complicated because it has a plurality of types of guard rings, and the manufacturing method is complicated due to increased number of times of performing an impurity implantation step to form the guard rings.

The present invention has been made to solve the problem described above, and has an object to provide a silicon carbide semiconductor device having a high breakdown voltage and a simple structure and a method for manufacturing such a silicon carbide semiconductor device.

Solution to Problem

A silicon carbide semiconductor device of the present invention has an element portion provided with a semiconductor element and a termination portion surrounding the element portion. The silicon carbide semiconductor device includes a silicon carbide film, a first main electrode, and a second main electrode. The silicon carbide film has a first main surface and a second main surface opposite to the first main surface. The second main surface has an element formation surface in the element portion and a termination surface in the termination portion. The silicon carbide film has a first range that constitutes the first main surface and an intermediate surface opposite to the first main surface, and has a second range that is provided on the intermediate surface and constitutes the element formation surface. The first range includes a first breakdown voltage holding layer having a first conductivity type, and a guard ring region that is partially provided at the intermediate surface in the termination portion, that surrounds the element portion at the intermediate surface, and that has a second conductivity type. The second range has a second breakdown voltage holding layer having the first conductivity type. The second range has one of a structure having only the second breakdown voltage holding layer in the termination portion and a structure disposed only in the element portion of the element portion and the termination portion. The first main electrode faces the first main surface. The second main electrode faces the element formation surface of the second main surface.

According to the silicon carbide semiconductor device, the second range has one of the structure having only the second breakdown voltage holding layer in the termination portion and the structure disposed only in the element portion of the element portion and the termination portion. When the second range has only the second breakdown voltage holding layer in the termination portion, it is not necessary to provide a structures other than the second breakdown voltage holding layer within the termination portion in the second range. When the second range has the structure disposed only in the element portion of the element portion and the termination portion, it is not necessary to provide the second range within the termination portion. In either case, the structure of the silicon carbide semiconductor device can be simplified.

Moreover, when the second range only has the second breakdown voltage holding layer in the termination portion, the portion of the second range in the termination portion is constituted only of the second breakdown voltage holding layer. Accordingly, the whole of the termination surface has the first conductivity type. Therefore, no pn junction is provided on the termination surface. Therefore, electric field concentration in the vicinity of the termination surface can be prevented. Therefore, a high electric field is prevented from being applied in the vicinity of the element formation surface adjacent to the termination surface. When the second range has the structure only disposed in the element portion of the element portion and the termination portion, the element formation surface is constituted of the second range and the termination surface is constituted of the first range rather than the second range. Accordingly, the position of the element formation surface and the position of the termination surface are shifted in the thickness direction. Therefore, electric field concentration in the vicinity of the termination surface can be suppressed from acting on the vicinity of the element formation surface. In either case, the element portion in the vicinity of the termination surface can be prevented from being broken.

As described above, according to the above-described silicon carbide semiconductor device, the structure of the silicon carbide semiconductor device can be simplified, and the breakdown voltage of the silicon carbide semiconductor device can be increased.

The first range may include a charge compensation region that is partially provided at the intermediate surface in the element portion, that has the second conductivity type, and that has an impurity concentration lower than an impurity concentration of the guard ring region. Accordingly, electric field in the element portion is suppressed, thereby increasing the breakdown voltage of the silicon carbide semiconductor device.

The element formation surface and the termination surface may be disposed on one flat plane. Accordingly, the shape of the surface of the silicon carbide film is simplified. Therefore, the structure of the silicon carbide semiconductor device can be more simplified.

The termination surface may be disposed to be shifted toward the first main surface from an imaginary plane including the element formation surface. Accordingly, the position of the element formation surface and the position of the termination surface are shifted in the thickness direction. Therefore, electric field concentration in the vicinity of the termination surface can be suppressed from acting on the vicinity of the element formation surface. Therefore, the element portion in the vicinity of the termination surface can be prevented from being broken more securely.

The second range may cover the guard ring region. That is, the second range may remain on the guard ring region. In this case, the method for manufacturing the silicon carbide semiconductor device can be simplified as compared with a case where the second range on the guard ring region is entirely removed.

The guard ring region may be located in the termination surface. In this case, the silicon carbide film does not have a portion covering the guard ring region. Accordingly, the electric field can be prevented from being diffracted by the guard ring. Therefore, the element portion in the vicinity of the termination surface can be prevented from being broken more securely.

A method for manufacturing a silicon carbide semiconductor device in the present invention is a method for manufacturing a silicon carbide semiconductor device having an element portion provided with a semiconductor element and a termination portion surrounding the element portion. The silicon carbide semiconductor device includes a silicon carbide film having a first main surface and a second main surface opposite to the first main surface. The second main surface has an element formation surface in the element portion and a termination surface in the termination portion. The method for manufacturing the silicon carbide semiconductor device includes the following steps.

There is formed a first range constituting the first main surface and an intermediate surface opposite to the first main surface. The step of forming the first range includes: the step of forming a first breakdown voltage holding layer that constitutes the first main surface and the intermediate surface and that has a first conductivity type; and the step of forming, partially at the intermediate surface in the termination portion, a guard ring region that surrounds the element portion at the intermediate surface and that has a second conductivity type. On the intermediate surface, there is formed a second range that constitutes the element formation surface. The step of forming the second range includes, after the step of forming the guard ring region, the step of forming a second breakdown voltage holding layer having the first conductivity type on the intermediate surface. The step of forming the second range is performed such that the second range has one of a structure having only the second breakdown voltage holding layer in the termination portion and a structure disposed only in the element portion of the element portion and the termination portion. There is formed a first main electrode facing the first main surface. There is formed a second main electrode facing the element formation surface of the second main surface.

According to the manufacturing method, the second range has one of the structure having only the second breakdown voltage holding layer in the termination portion and the structure disposed only in the element portion of the element portion and the termination portion. When the second range only has the second breakdown voltage holding layer in the termination portion, the portion of the second range in the termination portion is constituted only of the second breakdown voltage holding layer. Accordingly, the whole of the termination surface has the first conductivity type. Therefore, no pn junction is provided on the termination surface. Therefore, electric field concentration in the vicinity of the termination surface can be prevented. Therefore, a high electric field is prevented from being applied in the vicinity of the element formation surface adjacent to the termination surface. When the second range has the structure only disposed in the element portion of the element portion and the termination portion, the element formation surface is constituted of the second range and the termination surface is constituted of the first range rather than the second range. Accordingly, the position of the element formation surface and the position of the termination surface are shifted in the thickness direction. Therefore, electric field concentration in the vicinity of the termination surface can be suppressed from acting on the vicinity of the element formation surface. In either case, the element portion in the vicinity of the termination surface can be prevented from being broken.

Moreover, the second range does not need to include a portion having the second conductivity type in the termination portion. Accordingly, the method for manufacturing the silicon carbide semiconductor device can be simplified.

As described above, according to the manufacturing method, the breakdown voltage of the silicon carbide semiconductor device can be increased and the manufacturing method can be simplified.

The step of forming the second range may include the step of forming the termination surface shifted toward the first main surface from an imaginary plane including the element formation surface, by removing at least a portion of the second breakdown voltage holding layer in the termination portion. Accordingly, the position of the element formation surface and the position of the termination surface are shifted in the thickness direction. Therefore, electric field concentration in the vicinity of the termination surface can be suppressed from acting on the vicinity of the element formation surface. Therefore, the element portion in the vicinity of the termination surface can be prevented from being broken more securely.

Advantageous Effects of Invention

According to the present invention, as described above, the structure of the silicon carbide semiconductor device can be simplified and the breakdown voltage of the silicon carbide semiconductor device can be increased.

DESCRIPTION OF EMBODIMENTS

Figure 1:
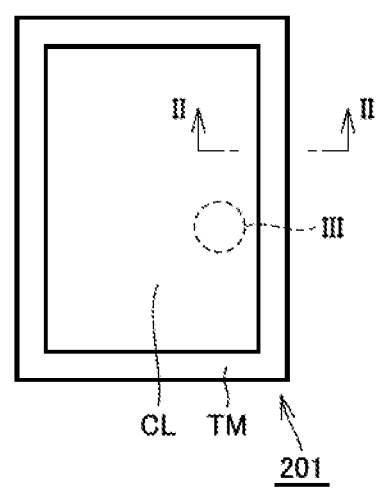
FIG. 1 is a plan view schematically showing a configuration of a silicon carbide semiconductor device in a first embodiment of the present invention.

The following describes embodiments of the present invention based on figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative crystallographic index is normally expressed by putting "–" (bar) above a numeral, but is expressed by putting the negative sign before the numeral in the present specification.

First Embodiment

Figure 2:
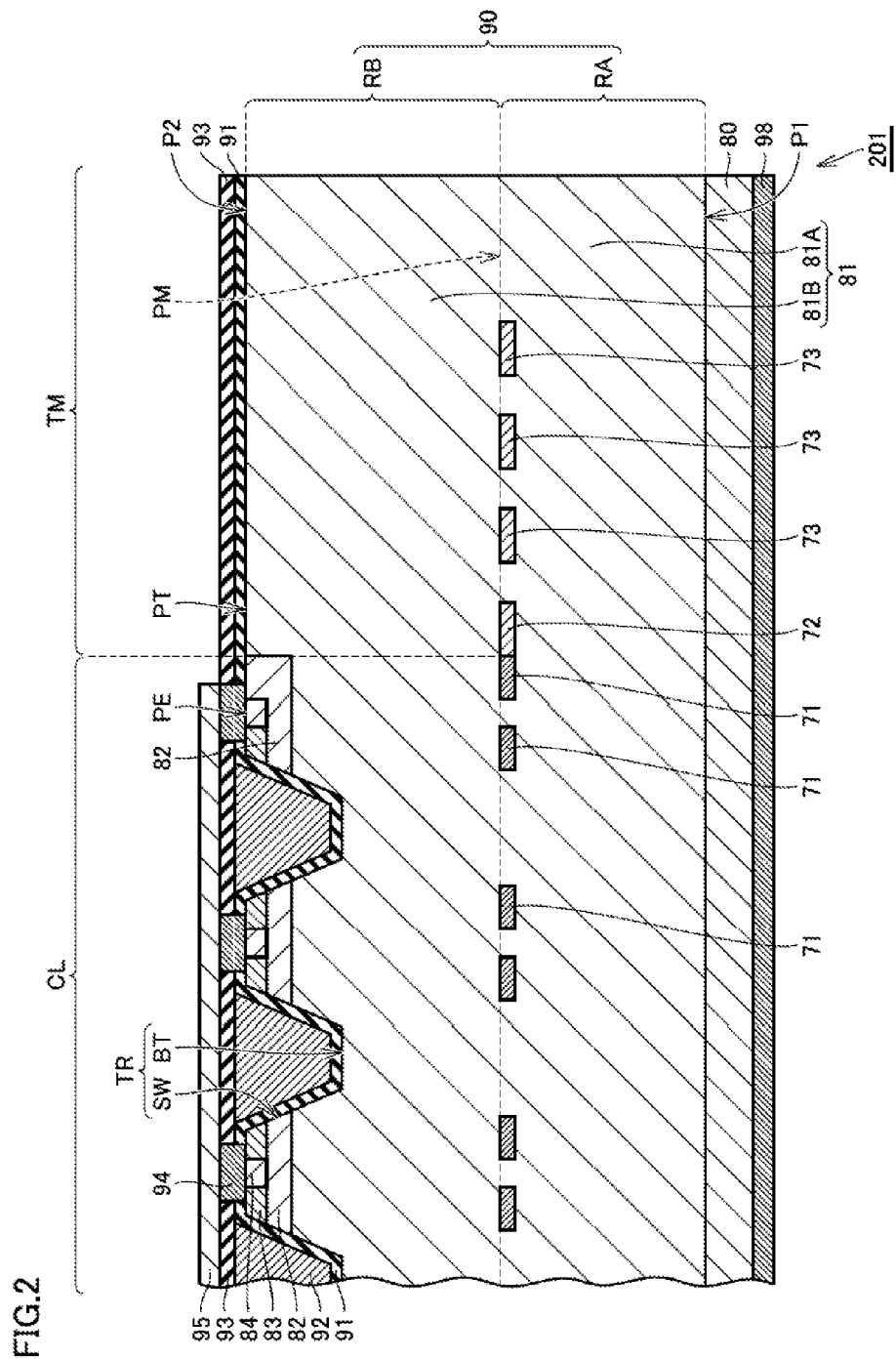
FIG. 2 is a partial schematic cross sectional view taken along a line II-II in FIG. 1.

As shown in FIG. 1, a MOSFET 201 (silicon carbide semiconductor device) includes: an element portion CL provided with a transistor element (semiconductor element); and a termination portion TM surrounding element portion CL. As shown in FIG. 2, MOSFET 201 has a single-crystal substrate 80, an epitaxial film 90 (silicon carbide film), a gate oxide film 91 (gate insulating film), a gate electrode 92, a drain electrode 98 (first main electrode), a source electrode 94 (second main electrode), an interlayer insulating film 93, and a source interconnection layer 95.

Single-crystal substrate 80 is made of n type (first conductivity type) silicon carbide. Single-crystal substrate 80 preferably has a hexagonal crystal structure, more preferably, has polytype 4H. Epitaxial film 90 (FIG. 3) is a silicon carbide film formed epitaxially on single-crystal substrate 80. Epitaxial film 90 has a lower surface P1 (first main surface) in contact with single-crystal substrate 80, and an upper surface P2 (second main surface opposite to the first main surface). Upper surface P2 has an element formation surface PE in element portion CL, and a termination surface PT in termination portion TM. Epitaxial film 90 has a lower range RA (first range) and an upper range RB (second range).

Lower range RA constitutes lower surface P and an intermediate surface PM opposite to lower surface P1. Lower range RA includes: a lower drift layer 81A (first breakdown voltage holding layer) having n type; a charge compensation region 71 having p type (second conductivity type different from the first conductivity type); a JTE (Junction Termination Extension) region 72 having p type; and a guard ring region 73 having p type.

Lower drift layer 81A preferably has an impurity concentration lower than the impurity concentration of single-crystal substrate 80. Lower drift layer 81A preferably has an impurity concentration of not less than $1 \times 10^{15}$ cm$^{-3}$ and not more than $5 \times 10^{16}$ cm$^{-3}$, for example, $8 \times 10^{15}$ cm$^{-3}$.

Charge compensation region 71 is partially provided at intermediate surface PM in element portion CL. Charge compensation region 71 preferably has an impurity concentration of not less than about $2.5 \times 10^{13}$ cm$^{-3}$.

In termination portion TM, JTE region 72 is partially provided at intermediate surface PM, is in contact with charge compensation region 71, and surrounds element portion CL. JTE region 72 has an impurity concentration lower than the impurity concentration of charge compensation region 71.

In termination portion TM, guard ring region 73 is partially provided at intermediate surface PM. At intermediate surface PM, guard ring region 73 surrounds element portion CL and is separated from JTE region 72. Guard ring region 73 preferably has an impurity concentration lower than the impurity concentration of charge compensation region 71, and may have the same impurity concentration as the impurity concentration of JTE region 72.

Figure 3:
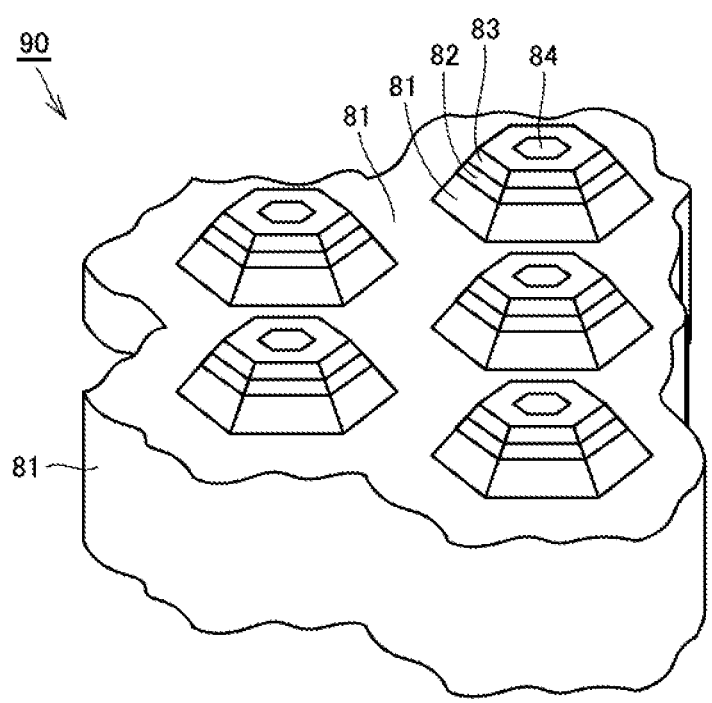
FIG. 3 is a schematic partial cross section perspective view of a silicon carbide film included in the silicon carbide semiconductor device in a broken line portion III of FIG. 1.

Upper range RB is provided on intermediate surface PM, and constitutes element formation surface PE and termination surface PT. Element formation surface PE and termination surface PT are disposed on one flat plane. As shown in FIG. 2 and FIG. 3, upper range RB includes: an upper drift layer 81B (second breakdown voltage holding layer) having n type; a base layer 82 having p type; a source region 83 having n type: and a contact region 84 having p type. Upper range RB has a structure only having upper drift layer 81B in termination portion TM. Lower drift layer 81A and upper drift layer 81B constitute drift region 81 (breakdown voltage holding region) in element portion CL.

Upper drift layer 81B preferably has an impurity concentration lower than the impurity concentration of single-crystal substrate 80, and more preferably has the same impurity concentration as the impurity concentration of lower drift layer 81A. In element portion CL, base layer 82 is provided on upper drift layer 81B. Base layer 82 has an impurity concentration of $1 \times 10^{18}$ cm$^{-3}$, for example. Source region 83 is provided on base layer 82, and is separated from upper drift layer 81B by base layer 82. Contact region 84 is connected to base layer 82.

In upper range RB of epitaxial film 90, a trench TR is provided at element formation surface PE. Trench TR has a side wall surface SW and a bottom surface BT. Side wall surface SW extends to upper drift layer 81B through source region 83 and base layer 82. Therefore, side wall surface SW includes a portion constituted of base layer 82. Side wall surface SW includes a channel surface of MOSFET 201 on base layer 82.

Side wall surface SW is inclined relative to element formation surface PE of epitaxial film 90, and trench TR therefore expands in a tapered manner toward the opening. The plane orientation of side wall surface SW is preferably inclined by not less than 50° and not more than 80° relative to a {000-1} plane, and is more preferably inclined by not less than 50° and not more than 80° relative to a (000-1) plane.

Side wall surface SW may have one of plane orientations of {0-33-8}, {0-11-2}, {0-11-4} and {0-11-1} when viewed macroscopically. It should be noted that the plane orientation of {0-33-8} has an off angle of 54.7° relative to the {000-1} plane. The plane orientation of {0-11-1} has an off angle of 75.10 relative to the {000-1} plane. Therefore, the plane orientations of {0-33-8}, {0-11-2}, {0-11-4}, and {0-11-1} correspond to off angles of 54.7° to 75.1°. In view of such a fact that there is considered a production error of about 5° with regard to the off angle, a process is performed to incline side wall surface SW by about not less than 50° and not more than 80° relative to the {000-1} plane, whereby the macroscopic plane orientation of side wall surface SW is likely to correspond to one of {0-33-8}, {0-11-2}, {0-11-4} and {0-11-1}.

Preferably, side wall surface SW has a predetermined crystal plane (also referred to as "special plane") particularly at its portion on base layer 82. Details of the special plane will be described later.

Bottom surface BT is separated from lower range RA by upper range RB. In the present embodiment, bottom surface BT has a flat shape substantially parallel to upper surface P2 of epitaxial film 90. It should be noted that bottom surface BT may not be a flat surface and may be substantially in the form of point when viewed in the cross section of FIG. 2, and in this case, trench TR has a V shape.

Gate oxide film 91 covers each of side wall surface SW and bottom surface BT of trench TR. Gate oxide film 91 has a portion connecting upper drift layer 81B and source region 83 to each other on base layer 82. Gate electrode 92 is for switching between the ON state and the OFF state of MOSFET 201. Gate electrode 92 is provided on gate oxide film 91. Gate electrode 92 is disposed on side wall surface SW with gate oxide film 91 interposed therebetween.

Source electrode 94 faces element formation surface PE of upper surface P2. Specifically, source electrode 94 is contact with each of source region 83 and contact region 84 on element formation surface PE. Source electrode 94 is an ohmic electrode and is made of silicide, for example. Source interconnection layer 95 is in contact with source electrode 94. Source interconnection layer 95 is, for example, an aluminum layer. Interlayer insulating film 93 insulates between gate electrode 92 and source interconnection layer 95.

Drain electrode 98 faces lower surface P1. Specifically, drain electrode 98 is provided on lower surface P1 of epitaxial film 90 with single-crystal substrate 80 being interposed therebetween.

The following describes a method for manufacturing MOSFET 201.

Figure 4:
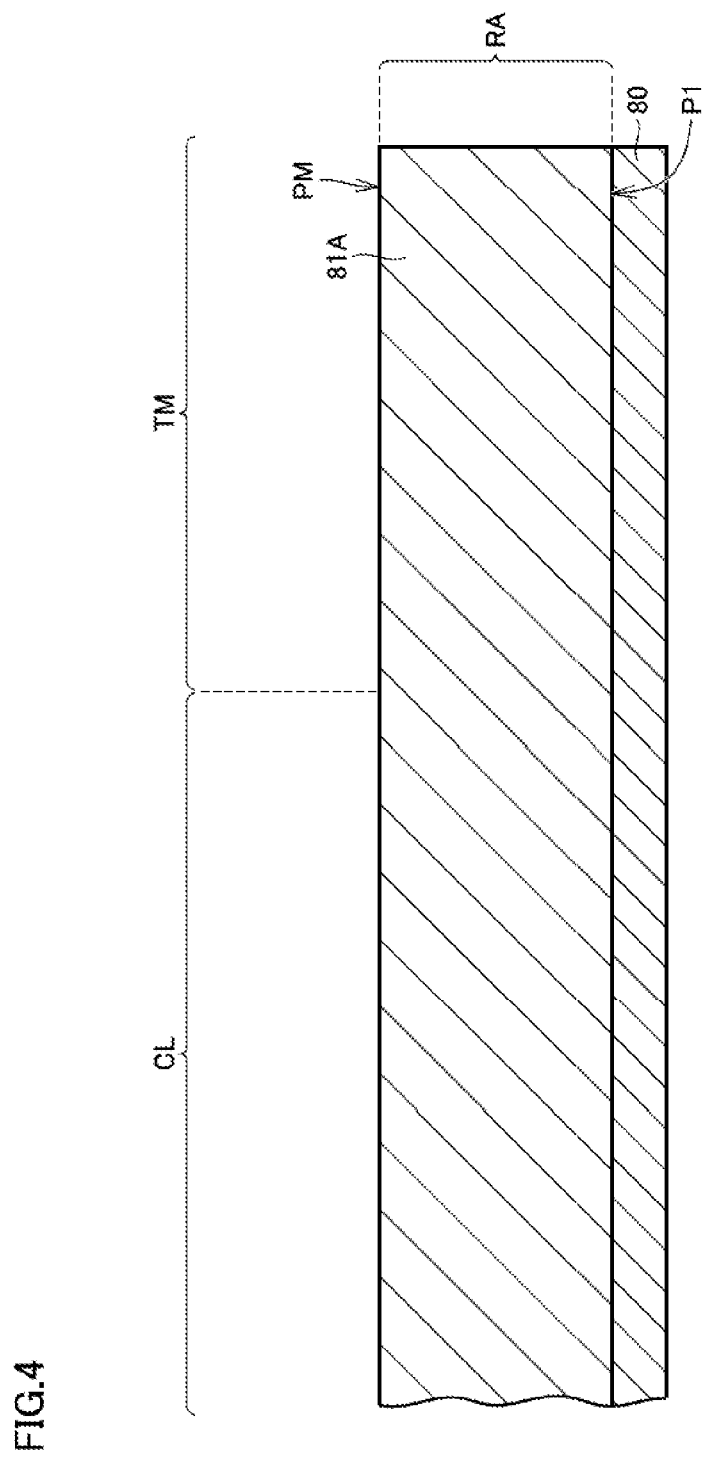
FIG. 4 is a partial cross sectional view schematically showing a first step of a method for manufacturing the silicon carbide semiconductor device of FIG. 2.
Figure 5:
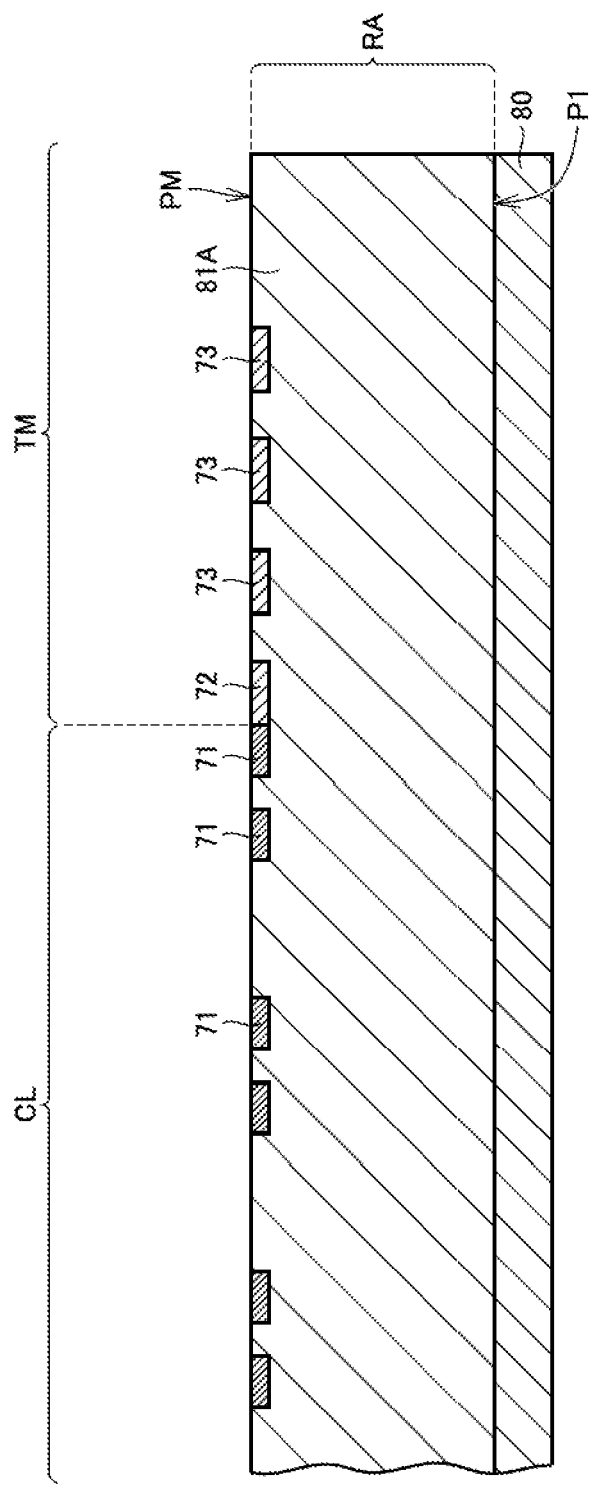
FIG. 5 is a partial cross sectional view schematically showing a second step of the method for manufacturing the silicon carbide semiconductor device of FIG. 2.

As shown in FIG. 4 and FIG. 5, lower range RA is formed on single-crystal substrate 80. Specifically, details thereof are as follows.

First, as shown in FIG. 4, by epitaxial growth of silicon carbide on single-crystal substrate 80, lower drift layer 81A is formed to constitute lower surface P1 and intermediate surface PM. The surface of single-crystal substrate 80 on which the epitaxial growth is performed preferably has an off angle of 8° or less relative to a {000-1} plane, more preferably, has an off angle of 8° or less relative to a (000-1) plane. The epitaxial growth can be performed by a CVD method. As a source material gas, a mixed gas of silane ($SiH_4$) and propane ($C_3H_8$) can be used, for example. In doing so, it is preferable to introduce nitrogen (N) or phosphorus (P) as an impurity, for example.

Next, as shown in FIG. 5, impurity regions are formed by impurity ion implantation into intermediate surface PM, which is exposed at this point of time. Specifically, charge compensation region 71 is partially formed at intermediate surface PM in element portion CL. Moreover, JTE region 72 and guard ring region 73 are partially formed at intermediate surface PM in termination portion TM. The impurity regions can be formed in any order. In the present embodiment, an impurity for providing p type, i.e., an acceptor, is implanted. As the acceptor, aluminum can be used, for example.

As shown in FIG. 6 to FIG. 10, upper range RB is formed on intermediate surface PM. The step of forming upper range RB is performed such that upper range RB has a structure only having upper drift layer 81B in termination portion TM. Specifically, details thereof are as follows.

Figure 6:
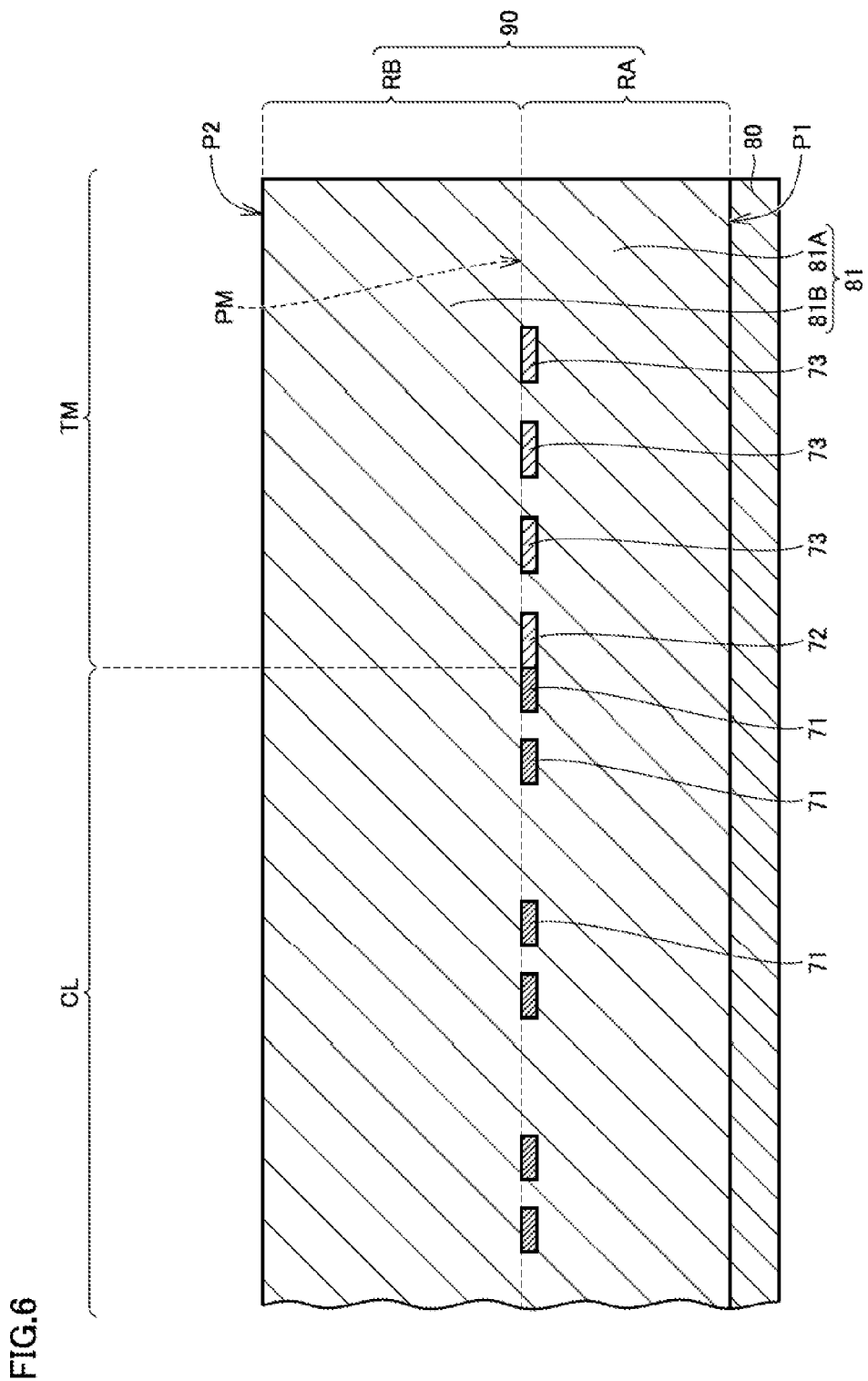
FIG. 6 is a partial cross sectional view schematically showing a third step of the method for manufacturing the silicon carbide semiconductor device of FIG. 2.

First, as shown in FIG. 6, upper drift layer 81B is formed by the same method as that for lower drift layer 81A. Accordingly, epitaxial film 90 having lower range RA and upper range RB is obtained.

Figure 7:
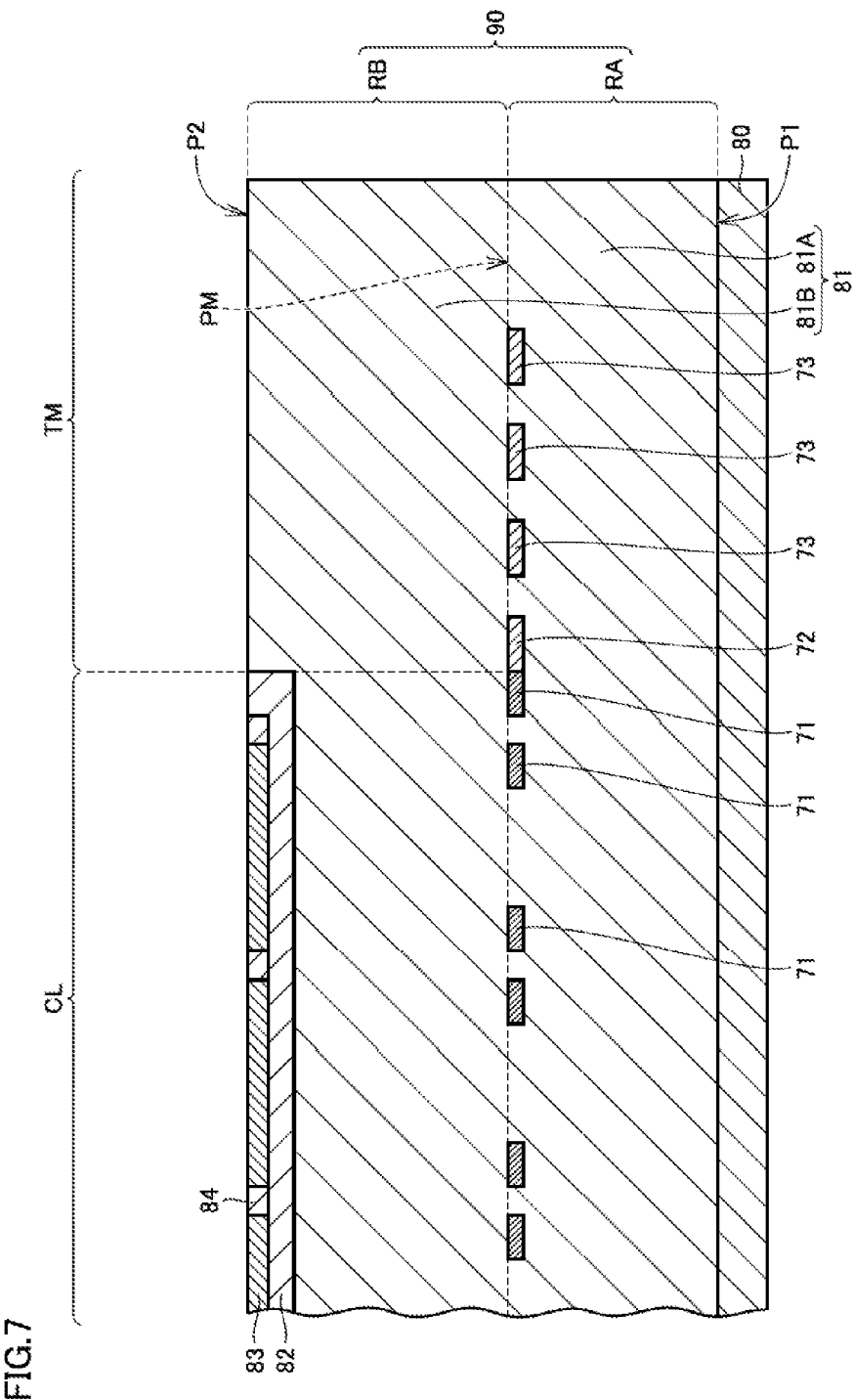
FIG. 7 is a partial cross sectional view schematically showing a fourth step of the method for manufacturing the silicon carbide semiconductor device of FIG. 2.

Next, as shown in FIG. 7, impurity regions are formed by impurity ion implantation into upper surface P2 of epitaxial film 90 in element portion CL. Specifically, in element portion CL, base layer 82 is formed on upper drift layer 81B. Moreover, on base layer 82, source region 83 separated from upper drift layer 81B by base layer 82 is formed. Moreover, in element portion CL, contact region 84 is formed to extend from upper surface P2 to base layer 82. The impurity regions may be formed in any order. It should be noted that, in termination portion TM, it is not necessary to perform impurity ion implantation into upper surface P2.

Next, heat treatment is performed to activate the impurities. This heat treatment is preferably performed at a temperature of not less than 1500° C. and not more than 1900° C., for example, a temperature of approximately 1700° C. The heat treatment is performed for approximately 30 minutes, for example. The atmosphere of the heat treatment is preferably an inert gas atmosphere, such as argon atmosphere.

Figure 8:
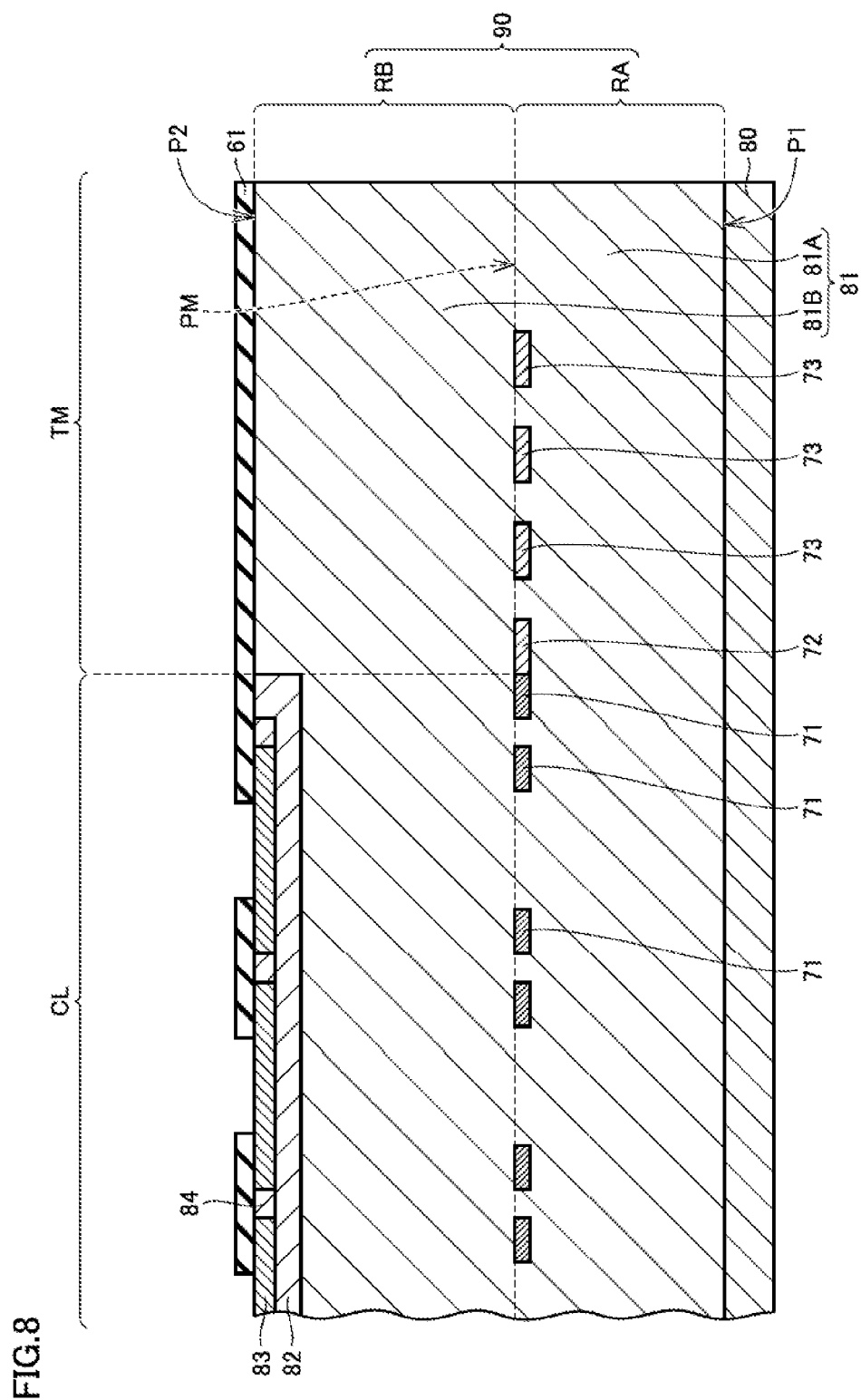
FIG. 8 is a partial cross sectional view schematically showing a fifth step of the method for manufacturing the silicon carbide semiconductor device of FIG. 2.

As shown in FIG. 8, a mask layer 61 having an opening is formed on upper surface P2 of epitaxial film 90. The opening is formed to correspond to the location of trench TR (FIG. 2). Mask layer 61 is preferably made of silicon dioxide, and is more preferably formed by thermal oxidation. In the present embodiment, the opening is formed only above a portion in element portion CL on upper surface P2.

Figure 9:
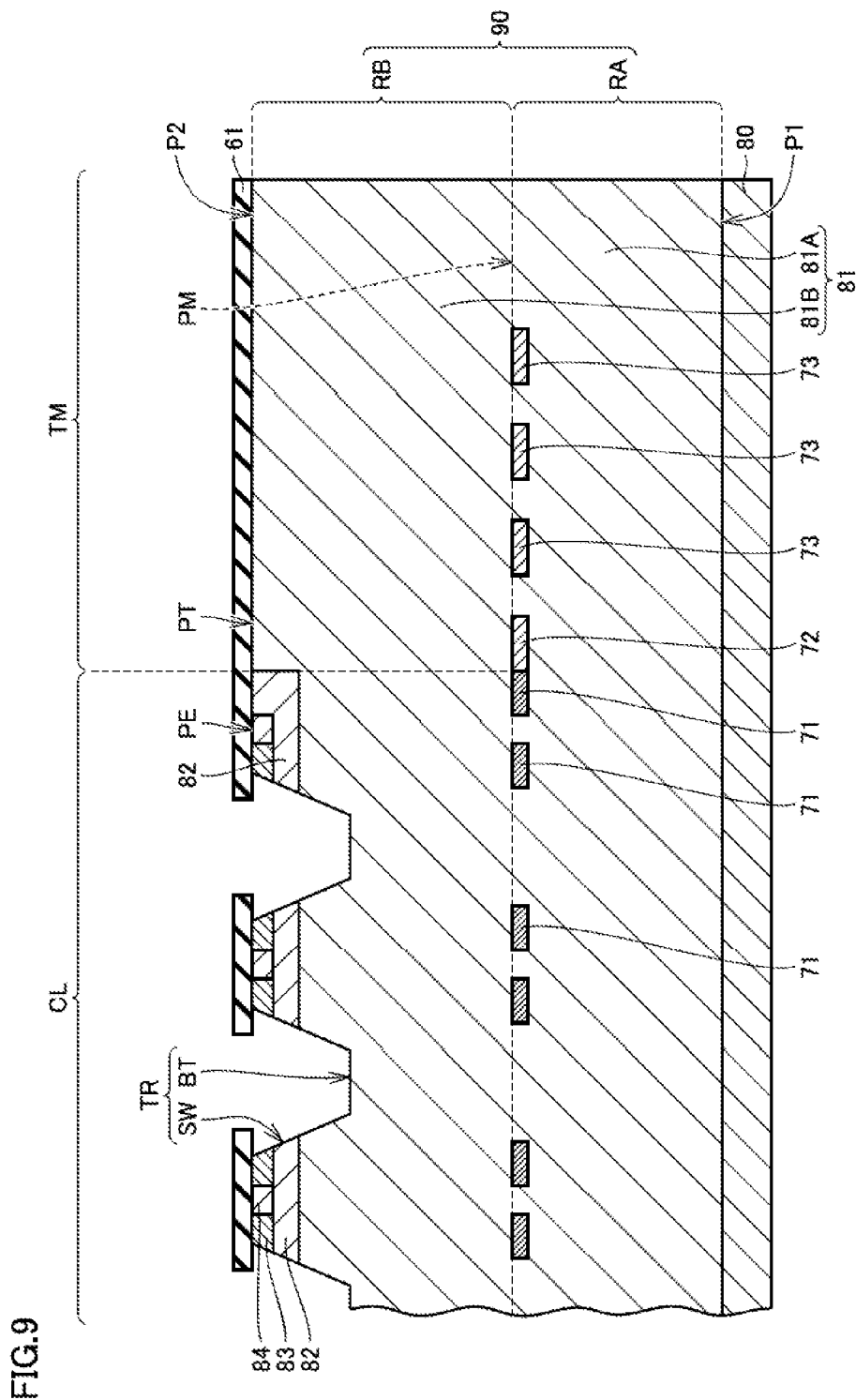
FIG. 9 is a partial cross sectional view schematically showing a sixth step of the method for manufacturing the silicon carbide semiconductor device of FIG. 2.

As shown in FIG. 9, thermal etching is performed using mask layer 61. Specifically, reactive gas is supplied to heated epitaxial film 90. The reactive gas can react with silicon carbide under heating, and preferably includes halogen gas. The reactive gas contains, for example, at least one of $Cl_2$, $BCl_3$, $CF_4$, and $SF_6$, in particular, preferably contains $Cl_2$. The reactive gas may further include oxygen gas. Moreover, the reactive gas may include carrier gas. Examples of usable carrier gas include nitrogen gas, argon gas, or helium gas. Epitaxial film 90 is heated at, for example, not less than about 700° C. and not more than about 1000° C.

Figure 10:
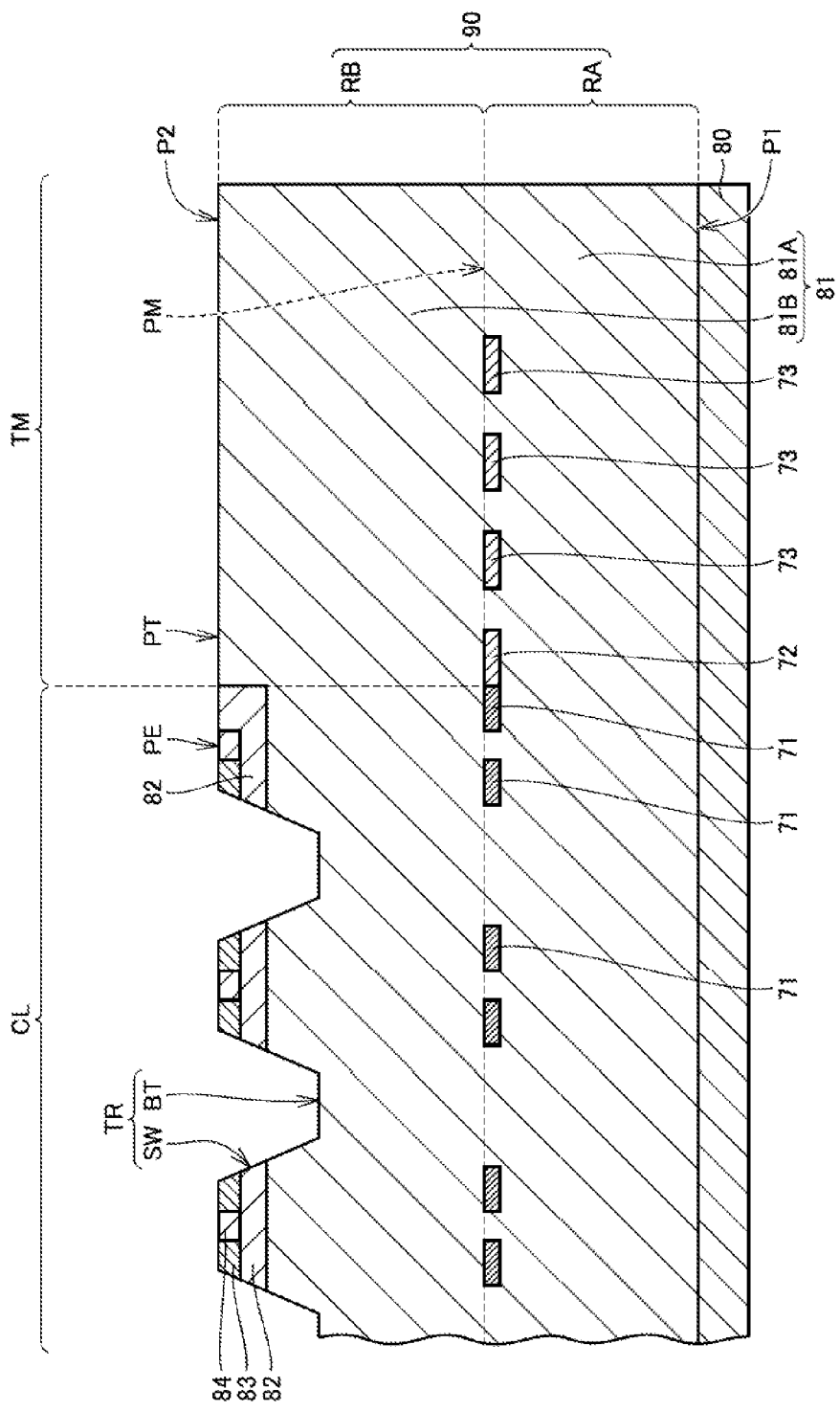
FIG. 10 is a partial cross sectional view schematically showing a seventh step of the method for manufacturing the silicon carbide semiconductor device of FIG. 2.

By this thermal etching, trench TR having side wall surface SW is formed in element formation surface PE of upper surface P2. In this thermal etching, silicon carbide is etched at an etching rate of about 70 μm/hour, for example. In this case, if mask layer 61 is made of silicon dioxide, mask layer 61 is significantly suppressed from being consumed. During the formation of trench TR by the thermal etching, a special plane is spontaneously formed on side wall surface SW, in particular, on base layer 82. Next, mask layer 61 is removed by means of an appropriate method such as etching (FIG. 10).

Figure 11:
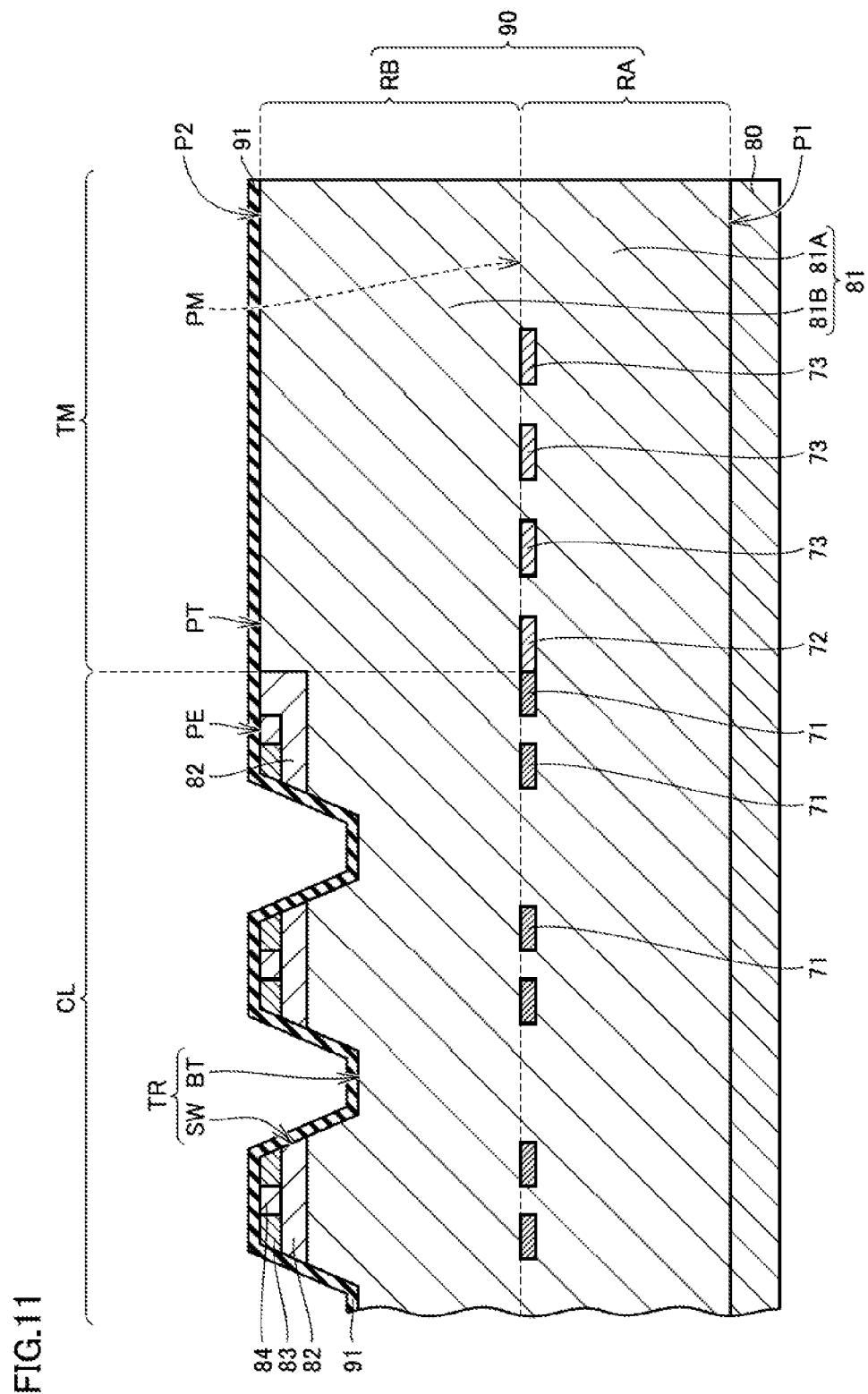
FIG. 11 is a partial cross sectional view schematically showing an eighth step of the method for manufacturing the silicon carbide semiconductor device of FIG. 2.

As shown in FIG. 11, gate oxide film 91 is formed on side wall surface SW and bottom surface BT of trench TR. Gate oxide film 91 has a portion connecting upper drift layer 81B and source region 83 to each other on base layer 82. Gate oxide film 91 is preferably formed by thermal oxidation.

After the formation of gate oxide film 91, NO annealing may be performed using nitrogen monoxide (NO) gas as an atmospheric gas. A temperature profile has such a condition that the temperature is not less than 1100° C. and not more than 1300° C. and holding time is approximately 1 hour, for example. Accordingly, nitrogen atoms are introduced in an interface region between gate oxide film 91 and base layer 82. As a result, formation of interface states in the interface region is suppressed, thereby achieving improved channel mobility. It should be noted that a gas other than the NO gas can be employed as the atmospheric gas as long as the nitrogen atoms can be thus introduced. After this NO annealing, Ar annealing may be further performed using argon (Ar) as an atmospheric gas. The Ar annealing is preferably performed at a heating temperature higher than the heating temperature in the above-described NO annealing and lower than the melting point of gate oxide film 91. This heating temperature is held for approximately 1 hour, for example. Accordingly, formation of interface states in the interface region between gate oxide film 91 and base layer 82 is further suppressed. It should be noted that instead of the Ar gas, an inert gas such as nitrogen gas may be employed as the atmospheric gas.

Figure 12:
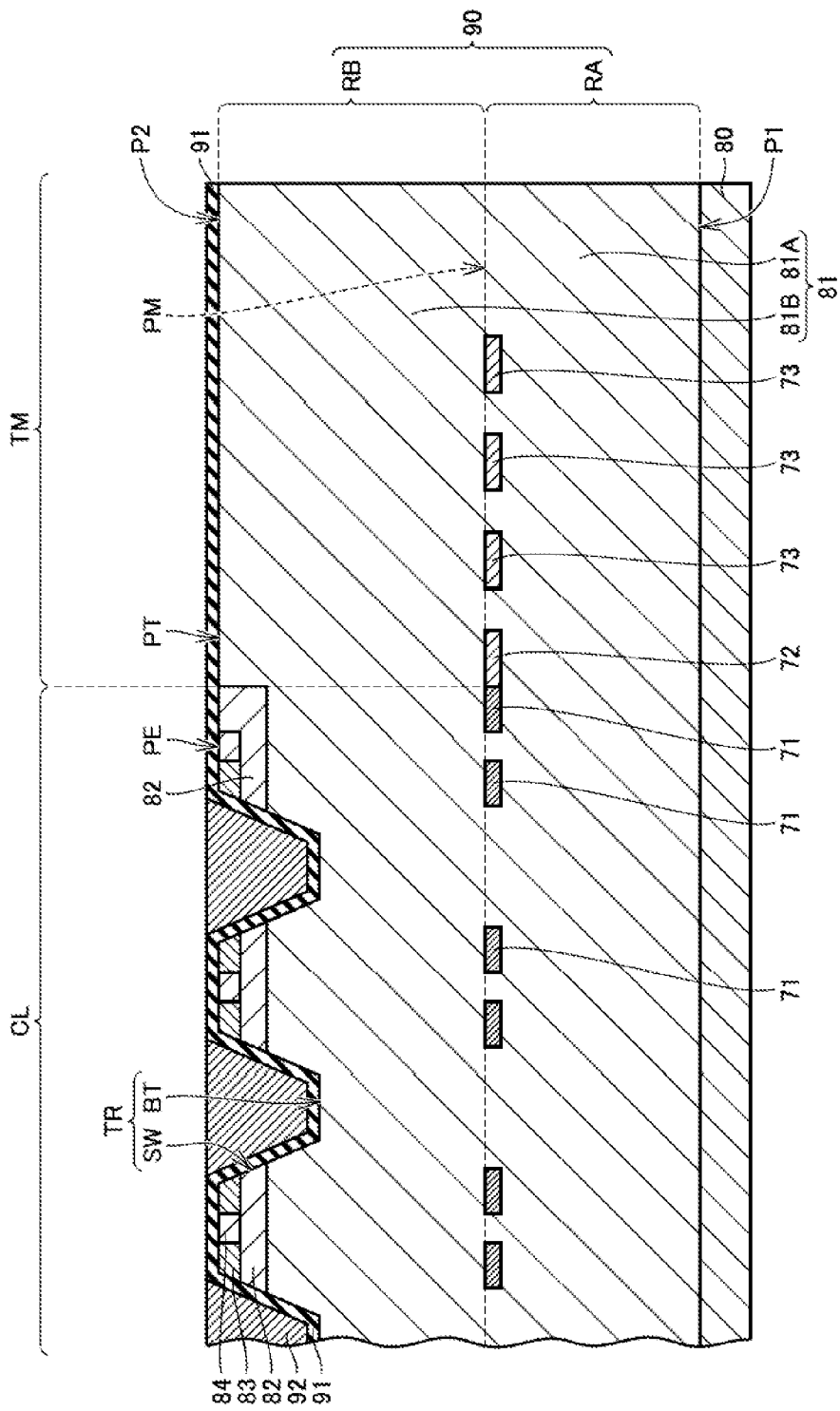
FIG. 12 is a partial cross sectional view schematically showing a ninth step of the method for manufacturing the silicon carbide semiconductor device of FIG. 2.

As shown in FIG. 12, gate electrode 92 is formed on gate oxide film 91. Specifically, gate electrode 92 is formed on gate oxide film 91 so as to at least partially fill the region inside trench TR with gate oxide film 91 interposed therebetween. Gate electrode 92 can be formed by, for example, forming a film of conductor or doped polysilicon and performing CMP.

Figure 13:
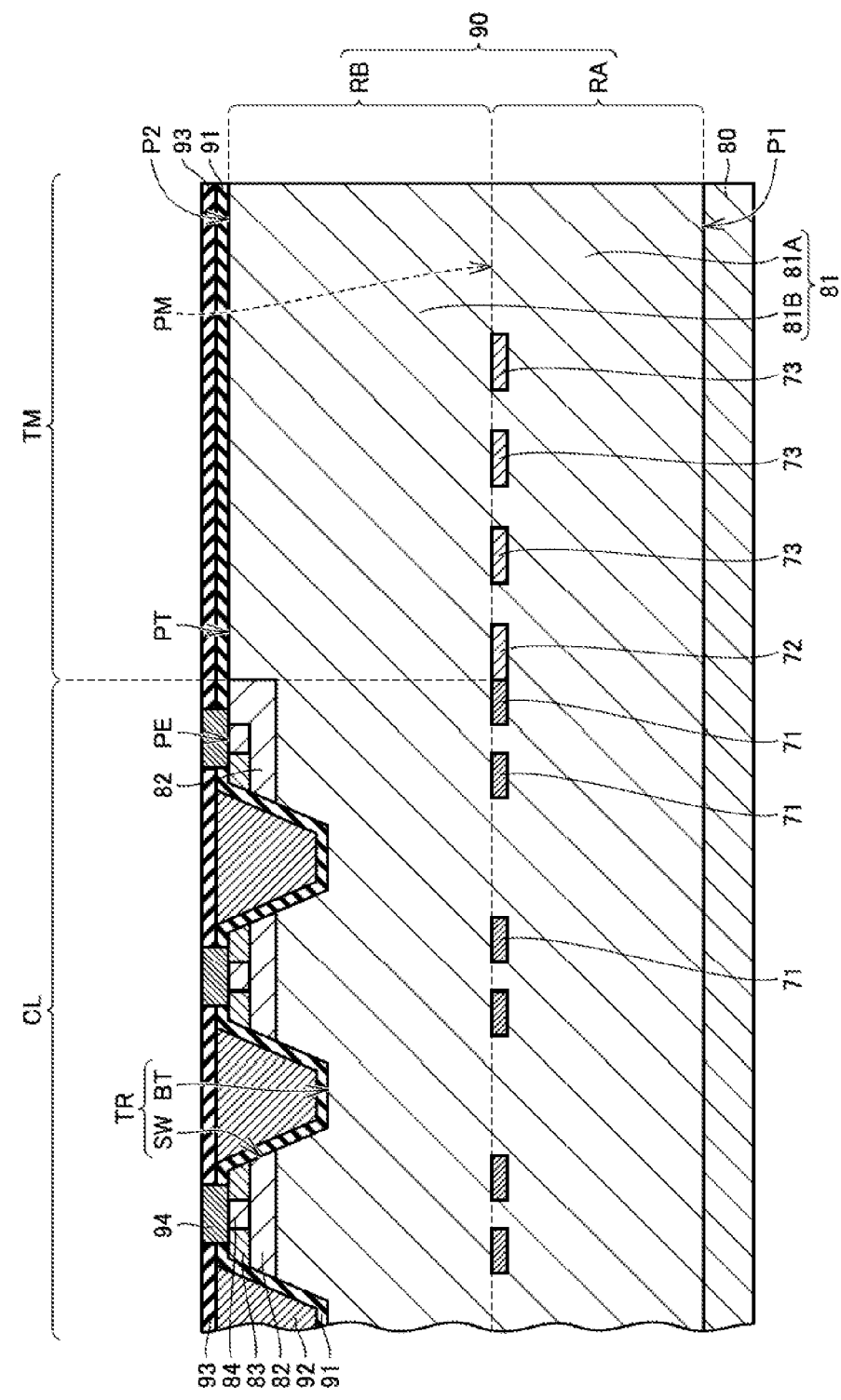
FIG. 13 is a partial cross sectional view schematically showing a tenth step of the method for manufacturing the silicon carbide semiconductor device of FIG. 2.

Referring to FIG. 13, interlayer insulating film 93 is formed on gate electrode 92 and gate oxide film 91 so as to cover the exposed surface of gate electrode 92. Etching is performed to form an opening in interlayer insulating film 93 and gate oxide film 91. Through the opening, each of source region 83 and contact region 84 is exposed on upper surface P2. Next, source electrode 94 is formed to face element formation surface PE of upper surface P2. Specifically, on upper surface P2, source electrode 94 is formed in contact with each of source region 83 and n contact region 84.

With reference to FIG. 2 again, drain electrode 98 is formed to face lower surface P1. Specifically, drain electrode 98 is formed on lower drift layer 81A with single-crystal substrate 80 interposed therebetween. Source interconnection layer 95 is formed. Accordingly, MOSFET 201 is obtained.

According to the present embodiment, upper range RB (FIG. 2) has a structure having only upper drift layer 81B in termination portion TM. In other words, it is not necessary to provide a structure other than upper drift layer 81B within termination portion TM in upper range RB. Therefore, the structure of MOSFET 201 can be simplified. Moreover, element formation surface PE and termination surface PT are disposed on one flat plane. Accordingly, the shape of the surface of epitaxial film 90 is simplified. Therefore, the structure of MOSFET 201 can be more simplified.

Meanwhile, the portion within termination portion TM in upper range RB is only constituted of upper drift layer 81B. Accordingly, the whole of termination surface PT has n type. Therefore, no pn junction is provided on termination surface PT. Therefore, electric field concentration in the vicinity of termination surface PT can be prevented. Therefore, a high electric field is prevented from being applied in the vicinity of element formation surface PE adjacent to termination surface PT. Therefore, element portion CL in the vicinity of termination surface PT can be prevented from being broken. Accordingly, the breakdown voltage of MOSFET 201 can be increased. Moreover, because lower range RA includes charge compensation region 71, the electric field in element portion CL is suppressed. In this way, the breakdown voltage of MOSFET 201 can be further increased.

It should be noted that the structure of MOSFET 201 (FIG. 2) is such that increased voltage is held by lower range RA as compared with that by upper range RB in termination portion TM during the OFF state. If such a structure is applied to a Si semiconductor device instead of the SiC semiconductor device, a breakage phenomenon of the Si layer in lower range RA is likely to take place, thus failing to attain a high breakdown voltage. Therefore, the structure of MOSFET 201 is not much suitable for the Si semiconductor device, and is particularly suitable for the SiC semiconductor device.

Second Embodiment

Figure 14:
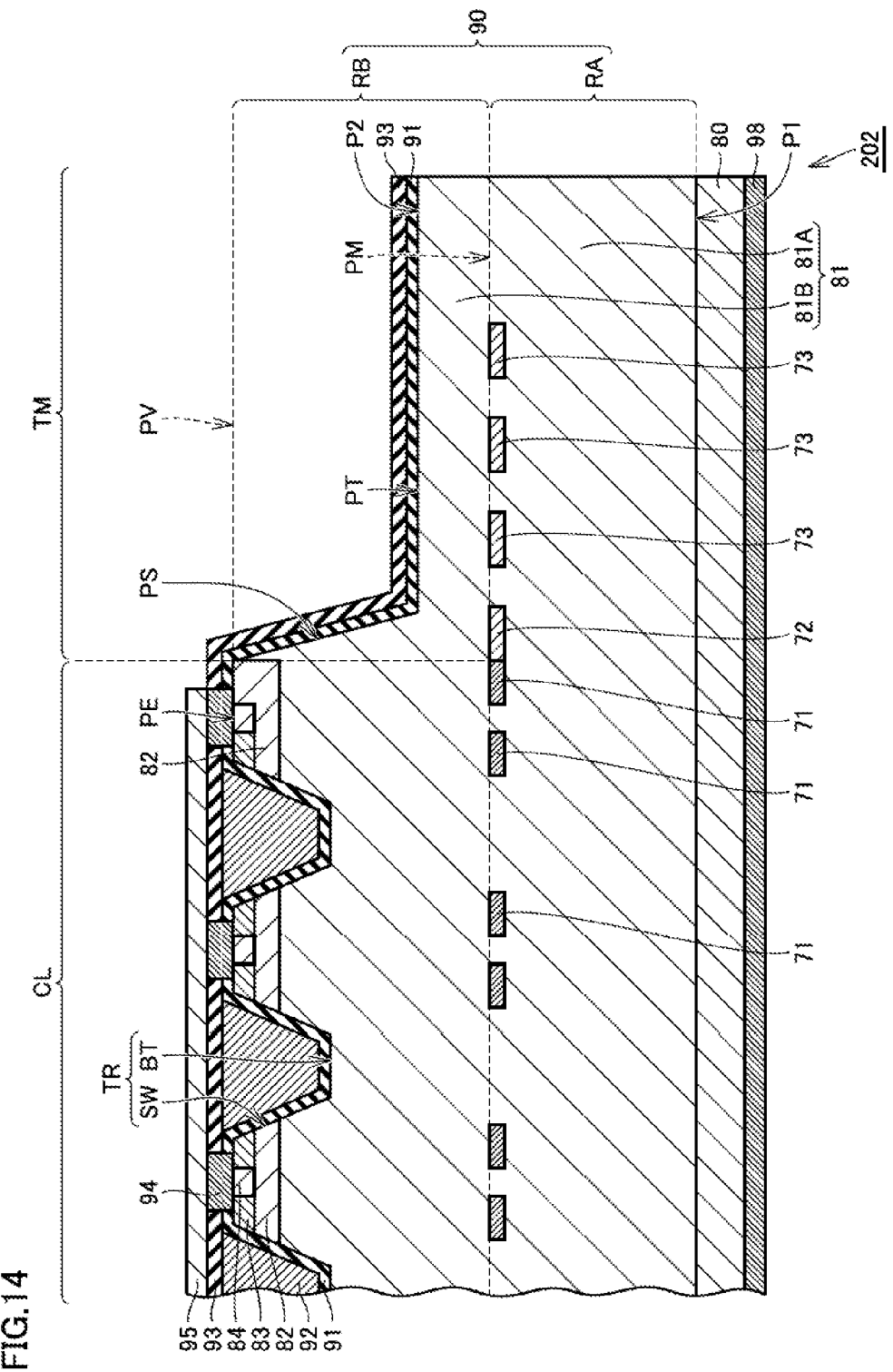
FIG. 14 is a partial cross sectional view schematically showing a configuration of a silicon carbide semiconductor device in a second embodiment of the present invention.

As shown in FIG. 14, in MOSFET 202 (silicon carbide semiconductor device) of the present embodiment, termination surface PT is disposed to be shifted toward lower surface P1 from an imaginary plane PV including element formation surface PE. Termination surface PT and element formation surface PE are connected to each other by a side surface PS located in termination portion TM. In the present embodiment, side surface PS is inclined at an angle of less than 90° relative to element formation surface PE. Side surface PS may be a special plane described below. Upper range RB covers guard ring region 73. The thickness of upper range RB between termination surface PT and intermediate surface PM is preferably not more than 1 μm.

Figure 15:
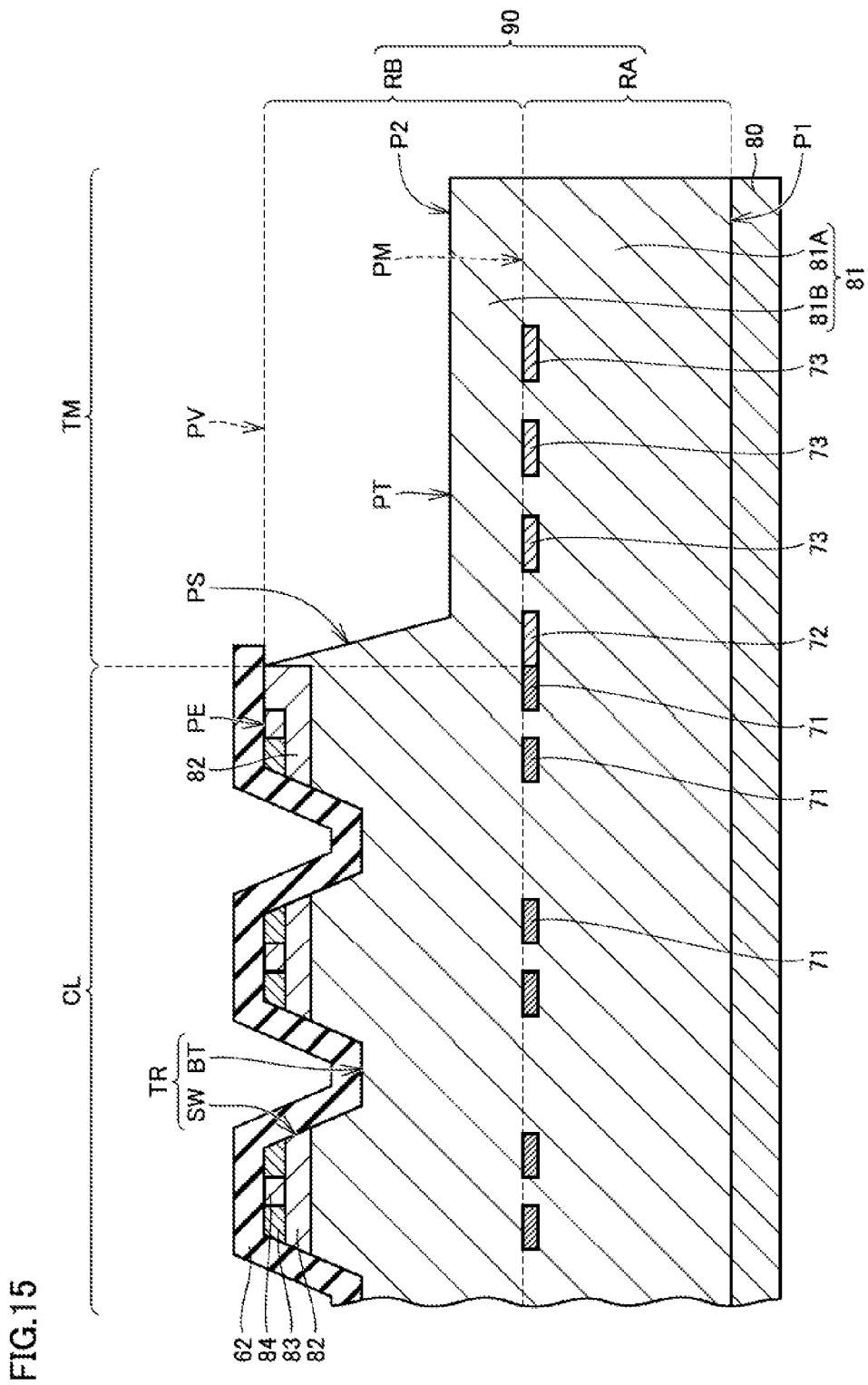
FIG. 15 is a partial cross sectional view schematically showing one step of a method for manufacturing the silicon carbide semiconductor device of FIG. 14.

In the manufacturing of MOSFET 202, as shown in FIG. 15, a portion of upper drift layer 81B is removed in termination portion TM when forming upper range RB. Accordingly, termination surface PT is formed to be shifted toward lower surface P1 from imaginary plane PV including element formation surface PE. Upper drift layer 81B is partially removed such that upper range RB remains on guard ring region 73. Upper drift layer 81B can be partially removed by, for example, thermal etching or reactive ion etching (RIE).

Apart from the configuration described above, the configuration of the present embodiment is substantially the same as the configuration of the first embodiment. Hence, the same or corresponding elements are given the same reference characters and are not described repeatedly.

According to the present embodiment, the position of element formation surface PE and the position of termination surface PT are shifted in the thickness direction. Therefore, electric field concentration in the vicinity of termination surface PT can be suppressed from acting on the vicinity of element formation surface PE. Therefore, element portion CL in the vicinity of termination surface PT can be prevented from being broken more securely. Accordingly, the breakdown voltage can be more improved.

Moreover, upper drift layer 81B is partially removed such that upper range RB remains on guard ring region 73. Accordingly, the manufacturing method can be simplified as compared with a case where upper range RB on guard ring region 73 is entirely removed. When the thickness of upper range RB remaining on intermediate surface PM is not more than 1 μm, electric field can be suppressed from being diffracted by guard ring region 73.

It should be noted that the structure of MOSFET 202 (FIG. 14) is such that increased voltage is held by lower range RA as compared with that by upper range RB in termination portion TM during the OFF state. If such a structure is applied to a Si semiconductor device instead of the SiC semiconductor device, a breakage phenomenon of the Si layer in lower range RA is likely to take place, thus failing to attain a high breakdown voltage. Therefore, the structure of MOSFET 202 is not much suitable for the Si semiconductor device, and is particularly suitable for the SiC semiconductor device.

Third Embodiment

Figure 16:
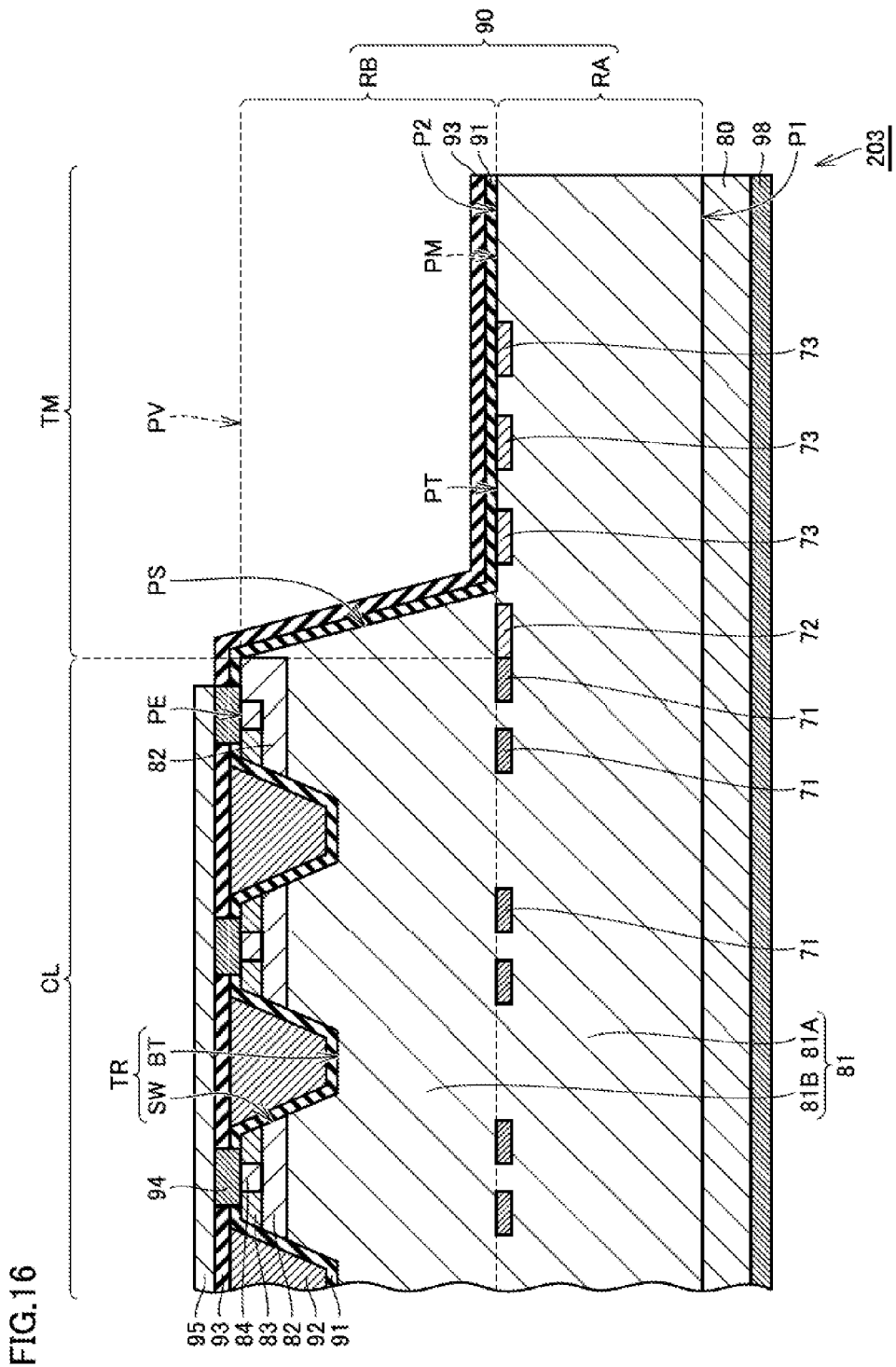
FIG. 16 is a partial cross sectional view schematically showing a configuration of a silicon carbide semiconductor device in a third embodiment of the present invention.

As shown in FIG. 16, in a MOSFET 203 (silicon carbide semiconductor device) of the present embodiment, guard ring region 73 is located at termination surface PT. Apart from the configuration described above, the configuration of the present embodiment is substantially the same as the configuration of the second embodiment. Hence, the same or corresponding elements are given the same reference characters and are not described repeatedly.

According to the present embodiment, epitaxial film 90 has no portion covering guard ring region 73. Accordingly, the electric field can be prevented from being diffracted by guard ring region 73. Therefore, element portion CL in the vicinity of termination surface PT can be prevented from being broken more securely. Accordingly, the breakdown voltage can be more improved.

It should be noted that the structure of MOSFET 203 (FIG. 16) is such that increased voltage is held by lower range RA as compared with that by upper range RB in termination portion TM during the OFF state. If such a structure is applied to a Si semiconductor device instead of the SiC semiconductor device, a breakage phenomenon of the Si layer in lower range RA is likely to take place, thus failing to attain a high breakdown voltage. Therefore, the structure of MOSFET 203 is not much suitable for the Si semiconductor device, and is particularly suitable for the SiC semiconductor device.

Fourth Embodiment

Figure 17:
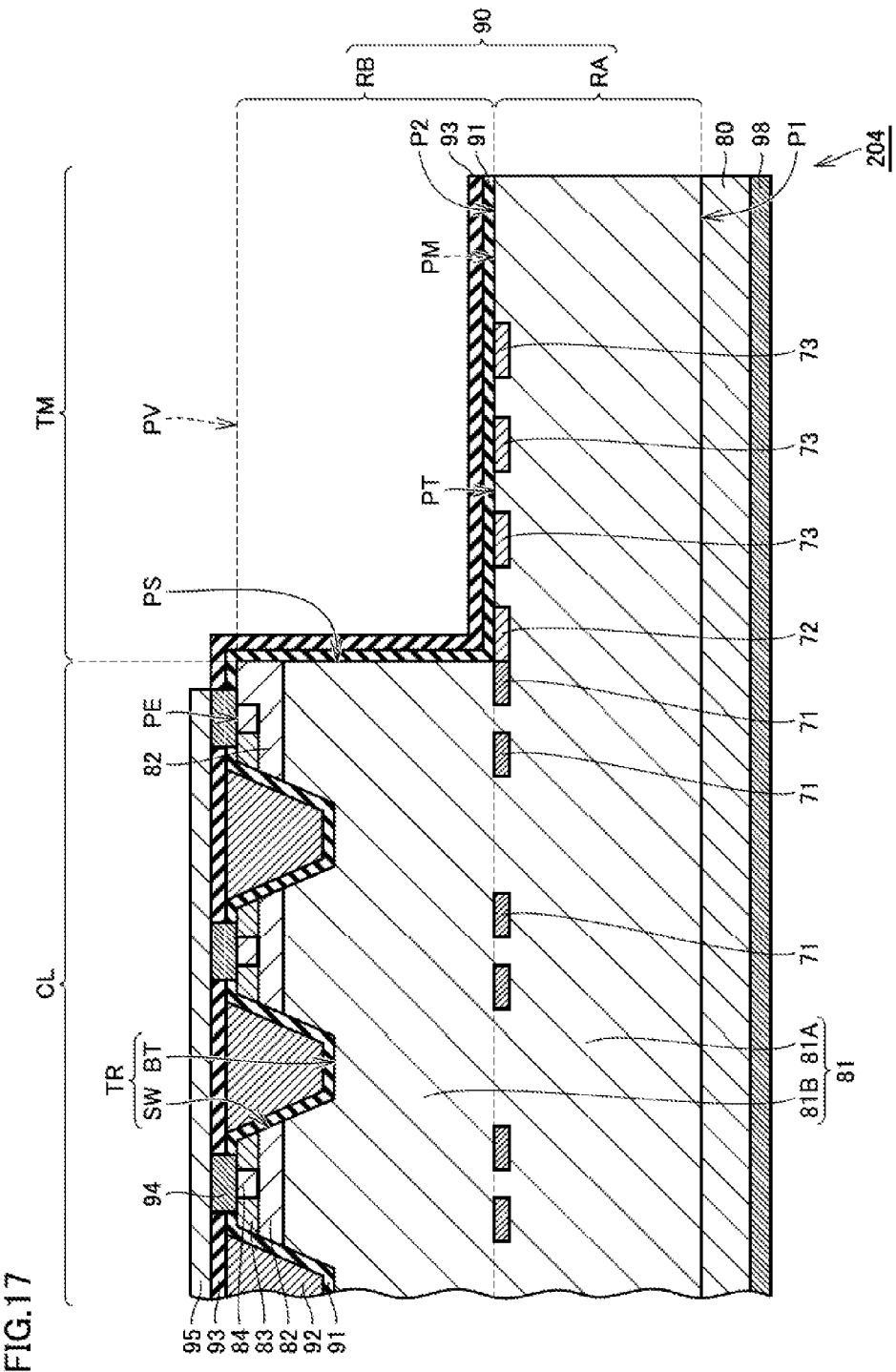
FIG. 17 is a partial cross sectional view schematically showing a configuration of a silicon carbide semiconductor device in a fourth embodiment of the present invention.

As shown in FIG. 17, in a MOSFET 204 (silicon carbide semiconductor device) of the present embodiment, upper range RB has a structure disposed only in element portion CL of element portion CL and termination portion TM. In other words, upper range RB is provided only external to termination portion TM. Accordingly, upper range RB constitutes element formation surface PE and lower range RA constitutes termination surface PT.

In the method for manufacturing MOSFET 204, when performing a step similar to that in FIG. 15 in order to form upper range RB, upper drift layer 81B is entirely removed in termination portion TM. As a result, upper range RB is provided only in element portion CL of element portion CL and termination portion TM. Accordingly, termination surface PT is formed to be shifted toward lower surface P1 from imaginary plane PV including element formation surface PE.

Apart from the configuration described above, the configuration of the present embodiment is substantially the same as the configuration of the third embodiment. Hence, the same or corresponding elements are given the same reference characters and are not described repeatedly.

According to the present embodiment, it is not necessary to provide upper range RB in termination portion TM. Therefore, the structure of MOSFET 201 can be simplified. Moreover, while element formation surface PE is constituted of upper range RB, termination surface PT is constituted of lower range RA rather than upper range RB. Accordingly, the position of element formation surface PE and the position of termination surface PT are shifted in the thickness direction. Therefore, electric field concentration in the vicinity of termination surface PT can be suppressed from acting on the vicinity of element formation surface PE. Therefore, element portion CL in the vicinity of termination surface PT can be prevented from being broken. Accordingly, breakdown voltage can be more improved.

It should be noted that the structure of MOSFET 204 (FIG. 17) is such that voltage is held only by lower range RA without using upper range RB in termination portion TM during the OFF state. If such a structure is applied to a Si semiconductor device instead of the SiC semiconductor device, a breakage phenomenon of the Si layer in lower range RA is likely to take place, thus failing to attain a high breakdown voltage. Therefore, the structure of MOSFET 203 is not much suitable for the Si semiconductor device, and is particularly suitable for the SiC semiconductor device.

Fifth Embodiment

Figure 18:
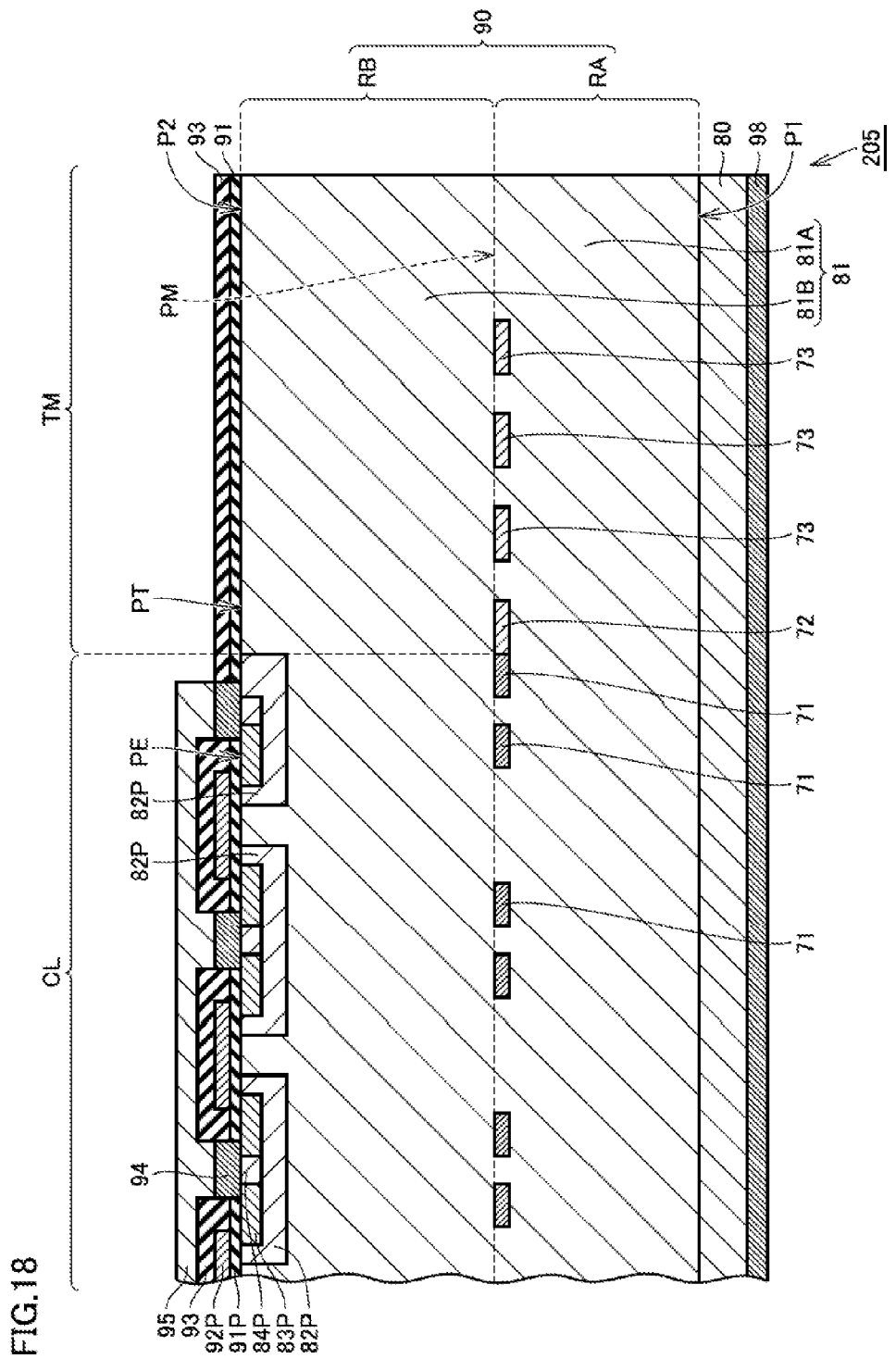
FIG. 18 is a partial cross sectional view schematically showing a configuration of a silicon carbide semiconductor device in a fifth embodiment of the present invention.

As shown in FIG. 18, a MOSFET 205 of the present embodiment, which is a modification of MOSFET 201 (FIG. 2), is not a trench type but a planer type. That is, trench TR (FIG. 2) is not provided at element formation surface PE of epitaxial film 90, and a planer gate structure is provided. Specifically, impurity regions such as a base layer 82P, a source region 83P, and a contact region 84P are formed on element formation surface PE in flat upper surface P2. Moreover, a gate oxide film 91P is provided on flat P2, and gate electrode 92P is provided thereon. Apart from the configuration described above, the configuration of the present embodiment is substantially the same as the configuration of the first embodiment. Hence, the same or corresponding elements are given the same reference characters and are not described repeatedly.

According to the present embodiment, strength of electric field applied to a boundary between base layer 82P and upper drift layer 81B is made lower, the strength of electric field being likely to be a determination factor for breakdown voltage in a planer type MOSFET. Accordingly, the breakdown voltage of MOSFET 205 can be increased.

It should be noted that a planer type MOSFET may be used which serves as a modification of each of trench type MOSFETs 202 to 204 (FIG. 14, FIG. 16, and FIG. 17) of the second to fourth embodiments. In other words, the trench type MOS structure in each of MOSFETs 202 to 204 may be replaced with such a planer type MOS structure as shown in the present embodiment.

(Configuration of Special Plane)

The following fully describes the "special plane" described above. As described above, side wall surface SW (FIG. 2) of trench TR preferably has a special plane particularly on base layer 82. The following describes a case where side wall surface SW has a special plane.

Figure 19:
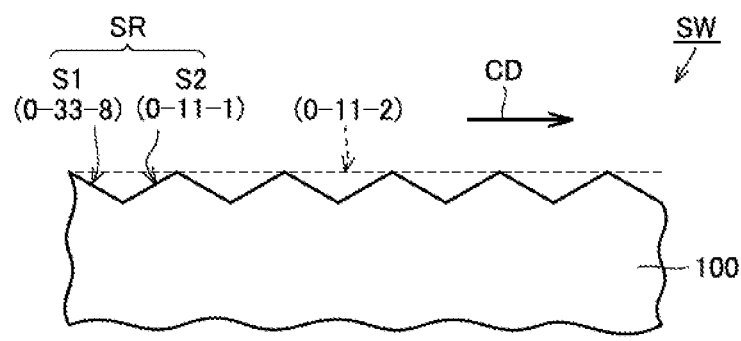
FIG. 19 is a partial cross sectional view schematically showing a fine structure of a surface of the silicon carbide film included in the silicon carbide semiconductor device.

As shown in FIG. 19, side wall surface SW having the special plane has a plane S1 (first plane). Plane S1 has a plane orientation of {0-33-8}, and preferably has a plane orientation of (0-33-8). Preferably, side wall surface SW microscopically includes plane S1. Preferably, side wall surface SW further microscopically includes a plane S2 (second plane). Plane S2 has a plane orientation of {0-11-1}, and preferably has a plane orientation of {0-11-1}. Here, the term "microscopically" refers to "minutely to such an extent that at least the size about twice as large as an interatomic spacing is considered". As a method for observing such a microscopic structure, for example, a TEM (Transmission Electron Microscope) can be used.

Preferably, side wall surface SW has a combined plane SR. Combined plane SR is formed of periodically repeated planes S1 and S2. Such a periodic structure can be observed by, for example, TEM or AFM (Atomic Force Microscopy). Combined plane SR has a plane orientation of {0-11-2}, and preferably has a plane orientation of {0-11-2}. In this case, combined plane SR has an off angle of 62° relative to the {000-1} plane, macroscopically. Here, the term "macroscopically" refers to "disregarding a fine structure having a size of approximately interatomic spacing". For the measurement of such a macroscopic off angle, a method employing general X-ray diffraction can be used, for example. Preferably, in the channel surface, carriers flow in a channel direction CD, in which the above-described periodic repetition is done.

Next, a detailed structure of combined plane SR will be illustrated.

Figure 20:
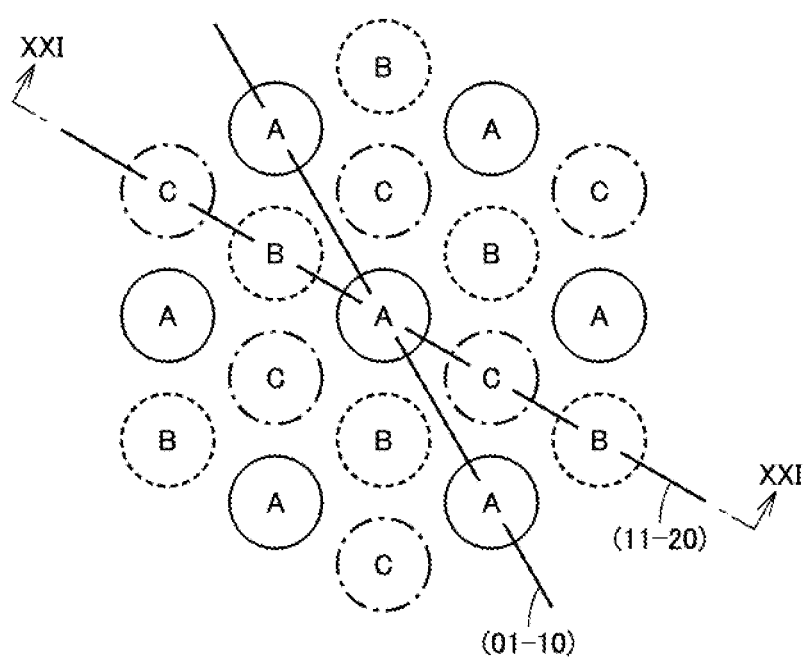
FIG. 20 shows a crystal structure of a (000-1) plane in a hexagonal crystal of polytype 4H.

Generally, regarding Si atoms (or C atoms), when viewing a silicon carbide single-crystal of polytype 4H from the {000-1} plane, atoms in a layer A (solid line in the figure), atoms in a layer B (broken line in the figure) disposed therebelow, and atoms in a layer C (chain line in the figure) disposed therebelow, and atoms in a layer B (not shown in the figure) disposed therebelow are repeatedly provided as shown in FIG. 20. In other words, with four layers ABCB being regarded as one period, a periodic stacking structure such as ABCBABCBABCB . . . is provided.

Figure 21:
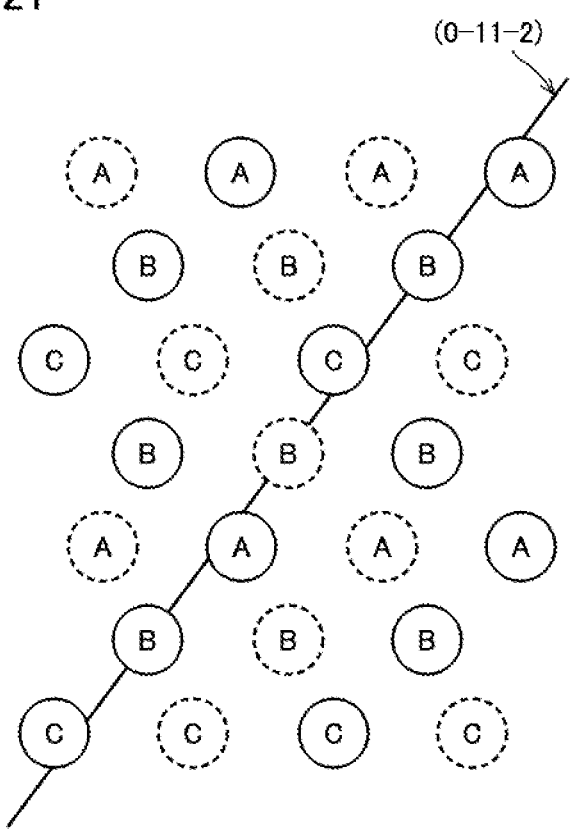
FIG. 21 shows a crystal structure of a (11-20) plane along a line XXI-XXI of FIG. 20.

As shown in FIG. 21, in the (11-20) plane (cross section taken along a line XXI-XXI of FIG. 20), atoms in each of four layers ABCB constituting the above-described one period are not aligned completely along the (0-11-2) plane. In FIG. 21, the (0-11-2) plane is illustrated to pass through the locations of the atoms in layers B. In this case, it is understood that each of atoms in layers A and C is deviated from the (0-11-2) plane. Hence, even when the macroscopic plane orientation of the surface of the silicon carbide single crystal, i.e., the plane orientation thereof with its atomic level structure being ignored is limited to (0-11-2), this surface can have various structures microscopically.

Figure 22:
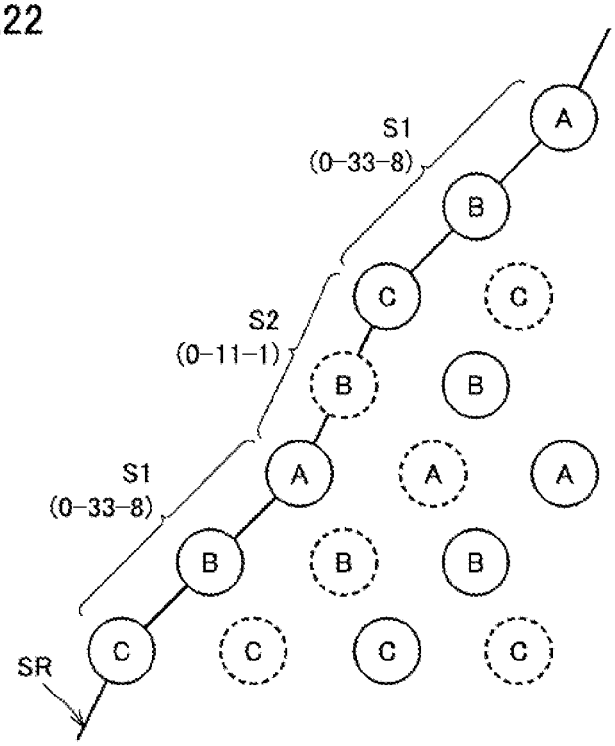
FIG. 22 shows a crystal structure in the vicinity of a surface with a combined plane of FIG. 19 within a (11-20) plane.

As shown in FIG. 22, combined surface SR is constructed by alternately providing planes S1 having a plane orientation of (0-33-8) and planes S2 connected to planes S1 and having a plane orientation different from that of each of planes S1. Each of planes S1 and S2 has a length twice as large as the interatomic spacing of the Si atoms (or C atoms). It should be noted that a plane with plane S1 and plane S2 being averaged corresponds to the (0-11-2) plane (FIG. 17).

Figure 23:
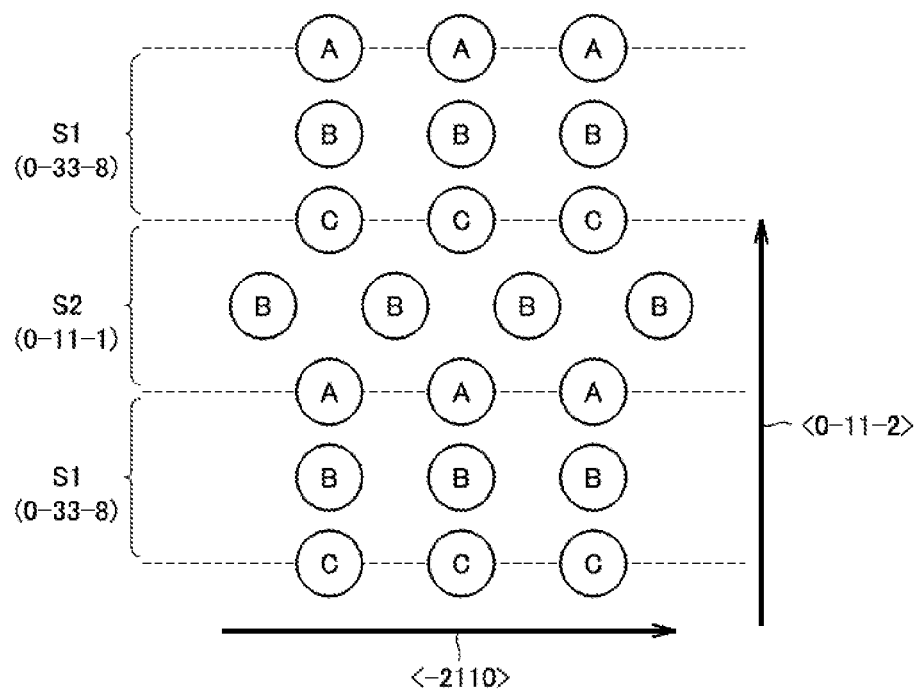
FIG. 23 shows a combined plane of FIG. 19 when viewed from a (01-10) plane.

As shown in FIG. 23, when viewing combined plane SR from the (01-10) plane, the single-crystal structure has a portion periodically including a structure (plane S1 portion) equivalent to a cubic structure. Specifically, combined plane SR is constructed by alternately providing planes S1 having a plane orientation of (001) in the above-described structure equivalent to the cubic structure and planes S2 connected to planes S1 and having a plane orientation different from that of each of planes S1. Also in a polytype other than 4H, the surface can be thus constituted of the planes (planes S1 in FIG. 19) having a plane orientation of (001) in the structure equivalent to the cubic structure and the planes (planes S2 in FIG. 23) connected to the foregoing planes and having a plane orientation different from that of each of the foregoing planes. The polytype may be 6H or 15R, for example.

Figure 24:
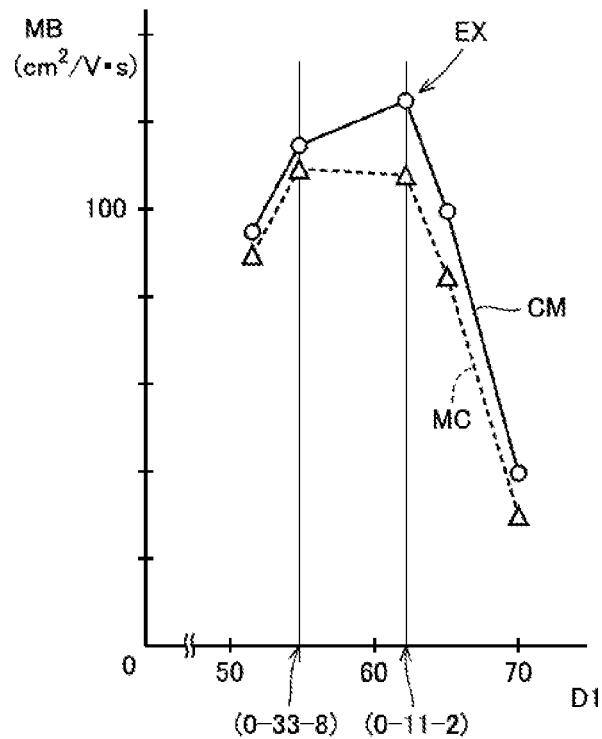
FIG. 24 is a graph showing an exemplary relation between channel mobility and an angle between a channel surface and the (000-1) plane when macroscopically viewed, in each of a case where thermal etching is performed and a case where no thermal etching is performed.

Next, with reference to FIG. 24, the following describes a relation between the crystal plane of side wall surface SW and mobility MB of the channel surface. In the graph of FIG. 24, the horizontal axis represents an angle D1 formed by the (000-1) plane and the macroscopic plane orientation of side wall surface SW having the channel surface, whereas the vertical axis represents mobility MB. A group of plots CM correspond to a case where side wall surface SW is finished to correspond to a special plane by thermal etching, whereas a group of plots MC correspond to a case where side wall SW is not thermally etched.

In group of plots MC, mobility MB is at maximum when the channel surface has a macroscopic plane orientation of (0-33-8). This is presumably due to the following reason. That is, in the case where the thermal etching is not performed, i.e., in the case where the microscopic structure of the channel surface is not particularly controlled, the macroscopic plane orientation thereof corresponds to (0-33-8), with the result that a ratio of the microscopic plane orientation of (0-33-8), i.e., the plane orientation of (0-33-8) in consideration of that in atomic level becomes statistically high.

On the other hand, mobility MB in group of plots CM is at maximum when the macroscopic plane orientation of the channel surface is (0-11-2) (arrow EX). This is presumably due to the following reason. That is, as shown in FIG. 22 and FIG. 23, the multiplicity of planes S1 each having a plane orientation of (0-33-8) are densely and regularly arranged with planes S2 interposed therebetween, whereby a ratio of the microscopic plane orientation of (0-33-8) becomes high in the channel surface.

Figure 25:
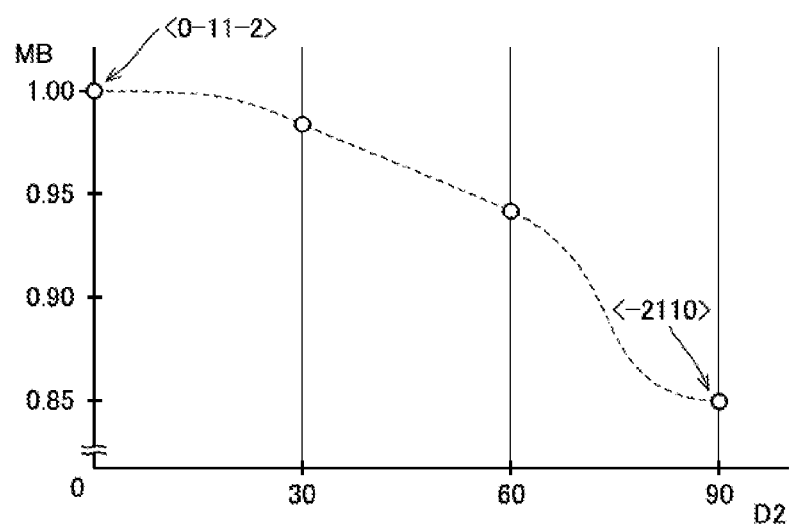
FIG. 25 is a graph showing an exemplary relation between the channel mobility and an angle between a channel direction and a <0-11-2> direction.

It should be noted that mobility MB has orientation dependency on combined plane SR. In a graph shown in FIG. 25, the horizontal axis represents an angle D2 between the channel direction and the <0-11-2> direction, whereas the vertical axis represents mobility MB (in any unit) in channel surface CH. A broken line is supplementarily provided therein for viewability of the graph. From this graph, it has been found that in order to increase channel mobility MB, channel direction CD (FIG. 19) preferably has an angle D2 of not less than 0° and not more than 60°, more preferably, substantially 0°.

Figure 26:
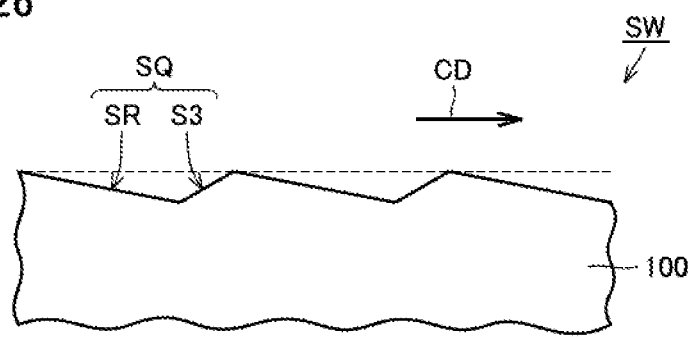
FIG. 26 shows a modification of FIG. 19.

As shown in FIG. 26, side wall surface SW may further include a plane S3 (third plane) in addition to combined plane SR (illustrated in a simplified manner by a straight line in FIG. 26). In this case, the off angle of side wall surface SW relative to the {000-1} plane is deviated from the ideal off angle of combined plane SR, i.e., 62°. Preferably, this deviation is small, preferably, in a range of ±0.10°. Examples of a surface included in such an angle range include a surface having a macroscopic plane orientation of the {0-33-8} plane. More preferably, the off angle of side wall surface SW relative to the (000-1) plane is deviated from the ideal off angle of combined plane SR, i.e., 62°. Preferably, this deviation is small, preferably, in a range of ±10°. Examples of a surface included in such an angle range include a surface having a macroscopic plane orientation of the (0-33-8) plane.

More specifically, side wall surface SW may include a combined plane SQ constituted of periodically repeated plane S3 and combined plane SR. Such a periodic structure can be observed by, for example, TEM or AFM (Atomic Force Microscopy).

(Silicon Carbide Semiconductor Device Having Special Plane)

When side wall surface SW (FIG. 2) of trench TR includes plane S1 (FIG. 19), a channel is formed in a plane having a plane orientation of {0-33-8}. Accordingly, part of on-resistance contributed by channel resistance is suppressed. Therefore, while maintaining the on-resistance to be equal to or less than a predetermined value, resistance by drift region 81 can be increased. Hence, the impurity concentration of drift region 81 can be made lower. Accordingly, the breakdown voltage of MOSFET 201 can be more increased. When side wall surface SW of trench TR microscopically includes plane S1 and plane S2, the on-resistance can be suppressed more. Accordingly, breakdown voltage can be more improved. When planes S1 and S2 of side wall surface SW constitute combined plane SR, the on-resistance can be suppressed more. Accordingly, breakdown voltage can be more improved.

APPENDIX

There can be employed a configuration in which n type (first conductivity type) and p type (second conductivity type) are replaced with each other in each of the above-described embodiments. Further, there can be also employed a configuration in which one or both of the charge compensation region and the JTE region are omitted. Further, the silicon carbide semiconductor device may be a MISFET (Metal Insulator Semiconductor Field Effect Transistor) other than the MOSFET, or a transistor other than the MISFET, such as an IGBT (Insulated Gate Bipolar Transistor). Moreover, the silicon carbide semiconductor device may not be a transistor, but may be a Schottky barrier diode, for example.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

61: mask layer; 71: charge compensation region; 72: JTE region; 73: guard ring region; 80: single-crystal substrate; 81: drift region (breakdown voltage holding region); 81A: lower drift layer (first breakdown voltage holding layer); 81B: upper drift layer (second breakdown voltage holding layer); 82, 82P: base layer (channel formation region); 83, 83P: source region; 84, 84P: contact region; 90: epitaxial film (silicon carbide film); 91, 91P: gate oxide film (gate insulating film); 92, 92P: gate electrode; 93: interlayer insulating film; 94: source electrode (second main electrode); 98: drain electrode (first main electrode); 200-205. MOSFET (silicon carbide semiconductor device); BT: bottom surface; CL: element portion; PM: intermediate surface; P1: lower surface (first main surface); P2: upper surface (second main surface); PE: element formation surface; PS: side surface; PV: imaginary plane, RA: lower range (first range), RB: upper range (second range); S1: plane (first plane); SQ, SR, combined plane; SW: side wall surface; TM: termination portion; TR: trench.

The invention claimed is:

1. A silicon carbide semiconductor device having an element portion provided with a semiconductor element and a termination portion surrounding said element portion, the silicon carbide semiconductor device comprising:
   a silicon carbide film having a first main surface and a second main surface opposite to said first main surface, said second main surface having an element formation surface in said element portion and a termination surface in said termination portion, said silicon carbide film having a first range that constitutes said first main surface and an intermediate surface opposite to said first main surface, said silicon carbide film having a second range that is provided on said intermediate surface and constitutes said element formation surface, said first range including a first breakdown voltage holding layer having a first conductivity type, said first range including a guard ring region that is partially provided at said intermediate surface in said termination portion, that surrounds said element portion at said intermediate surface, and that has a second conductivity type, said second range having a second breakdown voltage holding layer having said first conductivity type, said second range having only said second breakdown voltage holding layer in said termination portion, or having no epitaxial film directly above said guard ring region in said termination portion;
   a first main electrode facing said first main surface; and
   a second main electrode facing said element formation surface of said second main surface,
   wherein said first range includes a charge compensation region that is partially provided at said intermediate surface in said element portion and that has said second conductivity type, and
   wherein a junction termination extension region is provided in the termination portion in contact with the charge compensation region in the element portion, the junction termination extension region having the same impurity concentration as the guard ring region.

2. The silicon carbide semiconductor device according to claim 1, wherein said charge compensation region has an impurity concentration lower than an impurity concentration of said guard ring region.

3. The silicon carbide semiconductor device according to claim 1, wherein said element formation surface and said termination surface are disposed on one flat plane.

4. The silicon carbide semiconductor device according to claim 1, wherein said termination surface is closer to said first main surface than said element formation surface is.

5. The silicon carbide semiconductor device according to claim 4, wherein said second range covers said guard ring region.

6. The silicon carbide semiconductor device according to claim 4, wherein said guard ring region is located in said termination surface.

7. The silicon carbide semiconductor device according to claim 1,
   wherein said first range includes a charge compensation region that is partially provided at said intermediate surface in said element portion, that has said second conductivity type, and that has an impurity concentration lower than an impurity concentration of said guard ring region, and
   wherein said element formation surface and said termination surface are disposed on one flat plane.

8. The silicon carbide semiconductor device according to claim 1,
   wherein said first range includes a charge compensation region that is partially provided at said intermediate surface in said element portion, that has said second conductivity type, and that has an impurity concentration lower than an impurity concentration of said guard ring region, and
   wherein said termination surface is closer to said first main surface than said element formation surface is.

9. The silicon carbide semiconductor device according to claim 1,
   wherein said first range includes a charge compensation region that is partially provided at said intermediate surface in said element portion, that has said second conductivity type, and that has an impurity concentration lower than an impurity concentration of said guard ring region,
   wherein said termination surface is disposed to be shifted toward said first main surface from an imaginary plane including said element formation surface, and
   wherein said second range covers said guard ring region.

10. The silicon carbide semiconductor device according to claim 1,
    wherein said first range includes a charge compensation region that is partially provided at said intermediate surface in said element portion, that has said second conductivity type, and that has an impurity concentration lower than an impurity concentration of said guard ring region,
    wherein said termination surface is closer to said first main surface than said element formation surface is, and
    wherein said guard ring region is located in said termination surface.

* * * * *